US006934897B2

(12) United States Patent
Mukherjee et al.

(10) Patent No.: US 6,934,897 B2
(45) Date of Patent: Aug. 23, 2005

(54) SCHEDULING THE CONCURRENT TESTING OF MULTIPLE CORES EMBEDDED IN AN INTEGRATED CIRCUIT

(76) Inventors: Nilanjan Mukherjee, 29290 SW. Parkway Ct., Apartment 91, Wilsonville, OR (US) 97070; Chien-Chung Tsai, 9515 SW. Cherry La., Tualatin, OR (US) 97062; Wu-Tung Cheng, 19030 SW. 35th Pl., Lake Oswego, OR (US) 97034; Omer Ghazi Samman, 20366 Hoodview Ave., West Linn, OR (US) 97068; Yahya M. Z. Mustafa, 7925 SW. Vlahos Dr. #520, Wilsonville, OR (US) 97070; Paul J. Reuter, 89 Rice Ave., Northboro, MA (US) 01532; Yu Huang, 89 Ewald Ave., Marlborough, MA (US) 01752; Sudhakar Mannapuram Reddy, 1025 Denbigh Dr., Iowa City, IA (US) 52246

( * ) Notice: Subject to any disclaimer, the term of this patent is extended or adjusted under 35 U.S.C. 154(b) by 405 days.

(21) Appl. No.: 10/210,794

(22) Filed: Jul. 31, 2002

(65) Prior Publication Data

US 2003/0191996 A1 Oct. 9, 2003

Related U.S. Application Data

(60) Provisional application No. 60/370,877, filed on Apr. 5, 2002.

(51) Int. Cl.⁷ .............................................. G01R 31/28
(52) U.S. Cl. ...................................... 714/726; 714/745
(58) Field of Search ................................ 714/726, 745, 714/733, 738, 724; 706/13; 716/4; 709/247

(56) References Cited

U.S. PATENT DOCUMENTS 5,343,554 A * 8/1994 Koza et al. .................... 706/13

| | | | |
|---|---|---|---|
| 5,453,992 A | 9/1995 | Whetsel | |
| 5,504,670 A | 4/1996 | Barth et al. | |
| 5,570,374 A | 10/1996 | Yau et al. | |
| 6,061,284 A | 5/2000 | Dingemanse et al. | |
| 6,191,603 B1 | 2/2001 | Muradali et al. | |
| 6,237,123 B1 | 5/2001 | Kim et al. | |
| 6,249,893 B1 | 6/2001 | Rajsuman et al. | |
| 6,269,467 B1 | 7/2001 | Chang et al. | |
| 6,324,662 B1 | 11/2001 | Haroun et al. | |
| 6,625,784 B1 * | 9/2003 | Ohta et al. ...................... | 716/4 |
| 6,665,732 B1 * | 12/2003 | Garofalakis et al. ........ | 709/247 |

OTHER PUBLICATIONS

Hwang et al., "On Solving Rectangle Bin Packing Problems Using Genetic Algorithms", IEEE, 1994.*
Marinissen et al., "Wrapper Design for Embedded Core Test", IEEE ITC International Test Conference, pp. 911–920, 2000.*
Marinissen, Erik et al., "Test Protocol Scheduling for Embedded–Core Based System ICs," *IEEE International Workshop of Testing Embedded Core–Based System–Chips*, pp. 5.3–1–5.3–9, 1998.

(Continued)

*Primary Examiner*—David Ton
(74) *Attorney, Agent, or Firm*—Klarquist Sparkman, LLP

(57) ABSTRACT

Methods are described for scheduling the concurrent testing of multiple cores embedded in an integrated circuit. Test scheduling is performed by formulating the problem as a bin-packing problem and using a modified two-dimensional or three-dimensional bin-packing heuristic. The tests of multiple cores are represented as functions of at least the integrated circuit pins used to test the core and the core test time. The representations may include a third dimension of peak power required to test the core. The test schedule is represented as a bin having dimensions of at least integrated circuit pins and integrated circuit test time. The bin may include a third dimension of peak power. The scheduling of the multiple cores is accomplished by fitting the multiple core test representations into the bin.

37 Claims, 31 Drawing Sheets

OTHER PUBLICATIONS

Rincon, Ann Marie et al., "Core Design and System-on-a-Chip Integration," *IEEE Design & Test of Computers*, pp. 26–35, Oct.–Dec. 1997.

Zorian, Y. et al., "Testing Embedded–Core–Based System Chips," *Computer*, 32:52–60, Jun. 1999.

Chakrabarty, K., "Test Scheduling for Core–Based Systems Using Mixed–Integer Linear Programming," *IEEE Transactions on Computer–Aided Design of Integrated Circuits and Systems*, 19:1163–1174, Oct. 2000.

Bagchi, D. et al., "A Novel Strategy of Test Core Based Designs," *VLSI Design 2001*, pp. 122–127, Jun. 2000.

Chakrabarty, K., "Design of System–on–a–Chip Test Access Architectures under Place–and–Route and Power Constraints," *DAC 2000*, pp. 432–437, 2000.

Chakrabarty, K., "Design of System–on–a–Chip Test Access Architectures using Integer Linear Programming," *VTS 2000*, pp. 127–134, May 2000.

Huang, Y. et al., "Resource Allocation and Test Scheduling for Concurrent Test of Core–Based SOC Design," *ATS 2001*, pp. 265–270, Nov. 2001.

Fenrich, R. et al., "Multi–Tiered Algorithms for 2–Dimensional Bin Packing," *Proc. of Distributed Memory Computing Conference*, 1990.

Ravikumar, C.P. et al., "Simultaneous Module Selection and Scheduling for Power–Constrained Testing of Core Based Systems," *VLSI Design 2000*, 2000.

Ravikumar, C.P. et al., "A Polynomial–Time Algorithm for Power Constrained Testing of Core Based Systems," *ATS 1999*, pp. 107–112, 1999.

Zorian, Y., "Test Requirements for Embedded Core–based Systems and IEEE P1500," *ITC 1997*, pp. 191–199, Jul. 1997.

Immaneni, V. et al., "Direct Access Test Scheme—Implementation and Verification in Embedded ASIC Designs," *ITC 1990*, pp. 13–1.1 to 13–1.6, 1990.

Nourani, M. et al., "An ILP Formulation to Optimize Test Access Mechanism in System–on–Chip Testing," *ITC 2000*, pp. 902–910, 2000.

Whetsel, L., "Addressable Test Ports An Approach to Testing Embedded Cores," *ITC 1999*, pp. 1055–1064, 1999.

Marinissen, E. et al., "A Structured and Scalable Mechanism for Test Access to Embedded Reusable Cores," *ITC 1998*, pp. 284–292, 1998.

Varma, P. et al., "A Structural Test Re–Use Methodology for Core–Based System Chips," *ITC 1998*, pp. 294–302, 1998.

Ghosh, I. et al., "A Fast and Low–Cost Testing Technique for Core–Based System–Chips." *IEEE TCAD*, 19:863–877, 2000.

Touba, N. et al., "Testing Embedded Cores Using Partial Isolation Rings," *VTS 1997*, pp. 10–16, 1997.

Whetsel, L., "An IEEE 1149.1 Based Test Access Architecture For ICs With Embedded Cores," *ITC 1997*, pp. 69–78, 1997.

Sugihara, M. et al., "A Novel Test Methodology for Core–Based System LSIs and a Testing Time Minimization Problem," *ITC 1998*, pp. 465–472, 1998.

Iyengar, V. et al., "Test Wrapper and Test Access Mechanism Co–Optimization for System–on–Chip," *J. Electronic Testing*, 18:213–230, 2002.

Iyengar, V. et al., "Efficient Wrapper/TAM Co–Optimization for Large SOCs," *Proc. Design, Automation and Test in Europe (DATE) Conference*, pp. 491–498, 2002.

Larsson, E. et al., "An Integrated System–On–Chip Test Framework," *Proc. Design, Automation and Test in Europe (DATE) Conference*, 2001.

Iyengar, V. et al., "Precedence–Based, Preemptive, and Power–Constrained Test Scheduling for System–on–a–Chip," *VTS 2001*, pp. 368–374.

Sutanthavibul, S. et al., "An Analytical Approach to Floorplan Design and Optimization," *IEEE TCAD*, 10:761–769, 1991.

Hsiao, M. et al., "Effects of Delay Models on Peak Power Estimation of VLSI Sequential Circuits," *ICCAD 1997*, pp. 45–51, 1997.

Saxena, V. et al., "Monte–Carlo Approach for Power Estimation in Sequential Circuits," *ED&TC 1997*, pp. 416–420, 1997.

Immaneni, V. et al., "Direct Access Test Scheme—Design of Block and Core Cells for Embedded ASIC," *ITC 1990*, pp. 488–492, 1990.

Ghosh, I. et al., "A Low Overhead Design for Testability and Test Generation Technique for Core–Based Systems–on–a–Chip," *IEEE TCAD*, 18:1661–1676, Nov. 1999.

Marinissen, E. et al., "A Structural and Scalable Mechanism for Test Access to Embedded Reusable Cores," *ITC 1998*, pp. 284–293, 1998.

Marinissen, E. et al., "On Using IEEE P1500 SECT for Test Plug–n–Play," *ITC 2000*, pp. 770–777, 2000.

Marinissen, E. et al., "Wrapper Design for Embedded Core Test," *ITC 2000*, pp. 911–920, 2000.

Coffman, E.G. et al., "Performance Bounds for Level–Oriented Two–Dimensional Packing Algorithms," *Siam J. Comput.* 9:808–826, 1980.

\* cited by examiner

SCHEDULING THE CONCURRENT TESTING OF MULTIPLE CORES EMBEDDED IN AN INTEGRATED CIRCUIT

RELATED APPLICATIONS

This application claims the benefit of U.S. Provisional Patent Application No. 60/370,877, filed Apr. 5, 2002, which is incorporated herein by reference.

FIELD

The present invention relates generally to testing integrated circuits, and more specifically to a method for scheduling the testing of multiple cores embedded in an integrated circuit or system-on-chip.

BACKGROUND

Many of today's integrated circuit (IC) designs consist of a complete system on a chip (SOC). An SOC integrates multiple pre-designed and reusable circuits, termed "cores," onto a single integrated circuit. This integration allows SOC manufacturers to reduce design time and lower production costs. A basic SOC 10 containing multiple embedded cores is shown schematically in FIG. 1. Multiple cores 14 are embedded in the SOC 10. The cores 14 may comprise processor cores, memory cores, or logic cores. Each core has a number of core terminals or pins 16 that provide access to the internal circuitry of the core. Similarly, the SOC 10 has a number of integrated circuit or SOC terminals or pins 12 that provide access to the internal circuitry of the SOC and the multiple cores.

The time required to effectively test an SOC, which requires the separate testing of each individual core, is a major factor in overall production time. Therefore, as SOCs are produced with greater and greater levels of circuit density, efficient testing schemes that guarantee high fault coverage while minimizing test costs and chip area overhead are essential.

The cores of an SOC are typically tested using a number of structured "design-for-testability" (DFT) techniques. These techniques rest on the general concept of making all or some state variables (memory elements like flip-flops and latches) directly controllable and observable. If all state variables can be controlled or observed, a core can be treated for testing purposes as a combinational network. The most frequently used DFT methodology is based on using scan cells located internally within the core to form internal scan chains. A core that has been designed for testing according to this methodology is known as a "scan circuit" and has two modes of operation: a normal mode and a test mode. In the normal mode, the memory elements of the scan cells are configured to couple with the combinational logic of the core and perform their normal functions. In the test mode, the scan cells operate in multiple submodes that utilize test patterns to test the functional paths of the combinational logic. The most basic scan cell operates in at least two submodes: scan and capture. In the scan submode, the memory elements of the scan cells are configured to couple with one another to form shift registers called "scan chains." A set of test patterns may then be shifted into the scan chains. During the capture submode, the scan cells are briefly decoupled from one another and operate in their normal mode, thereby launching the test patterns through the functional paths of the combinational logic. The responses are then captured in various memory elements of the core, which usually include memory elements of the scan cells. The scan submode may then be repeated in order to shift the test responses out of the scan chains and simultaneously shift the next test patterns in. The test responses are then compared to fault-free responses to determine if the core-under-test (CUT) operates properly. In contrast, a core that does not have internal scan chains, a "non-scan circuit," is tested by providing test patterns to the core's inputs and reading the results at the core's outputs.

In order to test a core of an SOC, a connection must be provided between the core pins and the SOC pins. This connection is provided by one of several test access mechanisms (TAMs). The major types of TAMs include: parallel access (multiplexed access), serial access, and test bus access.

Parallel access to the core pins is achieved by using SOC pins exclusively dedicated to the core pins or by using shared SOC pins connected to multiple core pins through multiplexers. The advantage of this method is that the core can be tested as if it was stand alone, using previously created test patterns applied directly to the core. The disadvantages, however, are the pin requirement and the high area costs that result from routing and multiplexing overheads.

Serial access can be achieved using a number of different techniques. One such technique for achieving serial access to the core pins is to use scan chains positioned around the core and configured to access the individual pins of the core. This type of scan chain is typically referred to as a "wrapper" scan chain. Although a wrapper scan chain may be accessed with just two pins, thereby reducing the number of pins required to test a core, use of a wrapper scan chain may result in a corresponding increase in test application time due to the time required to shift patterns into and out of the scan chain.

Various schemes using buses for connecting the core pins with the SOC pins have also been used, often in combination with the parallel and serial access methods discussed above. One method involves the use of dedicated on-chip variable-width buses for propagating test data signals. Control signals are generated from an on-chip controller to control the configuration of test wrappers around the cores that provide paths between test buses and core terminals. Another technique using a test bus involves building a test "shell" around each core. Each test shell contains a local n-bit-wide test "rail". The test shells, which operate like wrapper scan chains, can be set to function mode, IP test mode, or bypass mode based on control signals. At the SOC level, global test rails are also built to connect different local test rails in different cores or to connect local test rails to SOC pins to obtain a flexible and scalable test bus architecture. Additionally, an "addressable test access port" architecture has been proposed that provides serial and parallel communication paths between each core and the SOC pins.

Testing of SOC cores further requires the creation of a carefully designed test schedule. The test schedule controls how and when the core pins should be accessed from the SOC pins via the test access mechanism. Because the test schedule affects the time required to test the SOC, it is an important consideration in reducing overall chip test time. Although several methodologies for scheduling the testing of cores have been developed, all suffer from some limitations. Most scheduling techniques, for instance, assume that a particular TAM of a fixed type and size is used during testing. These techniques are of limited applicability and do not offer a flexible approach to the test scheduling problem. Other techniques consider the scheduling problem in terms of groups of SOC pins. These techniques are also inflexible and do not allow the SOC pins to be freely associated with the cores being tested. Still other techniques do not consider the possibility of concurrent core testing. Concurrent core testing, however, allows unused resources to be utilized, thereby optimizing test scheduling. Further, most techniques do not consider the peak power used in a core test as a relevant constraint on test scheduling. Peak power limitations, however, are important considerations and may cause damage to the SOC if ignored. Although some techniques do consider peak power as a relevant constraint, none allow peak power to be considered as an integral part of the scheduling problem.

SUMMARY

The present disclosure provides methods for scheduling the testing of multiple cores embedded in an integrated circuit such as a SOC. Using the disclosed methods, multiple cores can be concurrently tested, thus maximizing the utilization of test resources and minimizing the test application time. Additionally, the disclosed methods allow either the number of integrated circuit pins available for testing or the total integrated circuit test time to be used as a constraint on test scheduling. Further, the disclosed methods are not limited to integrated circuits having a specific type of test access mechanism, thus allowing the methods to be generally applied. Additionally, the disclosed methods allow the SOC pins to be freely associated with any of the cores being tested, thus offering a highly flexible approach to the test scheduling problem. The disclosed methods can also be utilized while designing the test logic of an integrated circuit to give designers a clear understanding of the tradeoff between test application time and the number of integrated circuit pins needed for particular integrated circuit designs.

In one aspect, test scheduling is accomplished by using a modified two-dimensional bin-packing heuristic. First, the testing of multiple cores are represented as functions of at least the integrated circuit pins used to test the core and the core test time. Next, the test schedule of the integrated circuit is represented as a bin having dimensions of at least integrated circuit pins and integrated circuit test time. Finally, the scheduling of the multiple cores is accomplished by fitting the multiple core test representations into the bin.

In another aspect, test scheduling is accomplished by using a modified three-dimensional bin-packing heuristic. First, the testing of multiple cores are represented as functions of at least the integrated circuit pins used to test the core, the core test time, and the peak power required to test the core. Next, the test schedule of the integrated circuit is represented as a bin having dimensions of at least integrated circuit pins, integrated circuit test time, and peak power. Finally, the scheduling of the multiple cores is accomplished by fitting the multiple core test representations into the bin.

Further features and advantages of the disclosed technology will become apparent with reference to the following detailed description and accompanying drawings.

DETAILED DESCRIPTION

The methods for scheduling the concurrent testing of embedded cores as shown and described herein are implemented in software stored on a computer-readable medium and executed on a general-purpose computer. The disclosed method, for example, can be implemented in computer-aided testing tools. Further, the disclosed method may be executed on a single computer or on a networked computer. For clarity, only those aspects of the software germane to the disclosed technology are described; product details well known in the art are omitted. For the same reason, the computer hardware is not described in further detail. It should thus be understood that the disclosed technology is not limited to any specific computer language, program, or computer.

The invention is described below in connection with representative embodiments that are not intended to be limiting in any way. Although the specific embodiments are discussed as relating to an SOC, the method described can be applied to any integrated circuit containing multiple embedded cores. Additionally, although the specific embodiments discussed below focus on cores tested using externally generated test patterns, the method described can be applied to the testing of cores using internally generated test patterns (e.g., cores using Built-In-Self-Test (BIST) technology).

General Considerations

In each of the methods presented in this disclosure, the testing of a core is conceptualized as a multi-dimensional representation. Correspondingly, the test schedule of the SOC is conceptualized as a multi-dimensional representation capable of holding or being packed by the representations. The task of scheduling the concurrent testing of cores is therefore viewed as one of arranging the core representations into the test schedule representation so as to minimize a selected dimension. It is understood, however, that the testing of a core may actually be represented as a database entry having two or more parameters and that the test schedule of the SOC may actually be represented as a database that is compiled using a computer program implementing the disclosed methods.

Figure 1:
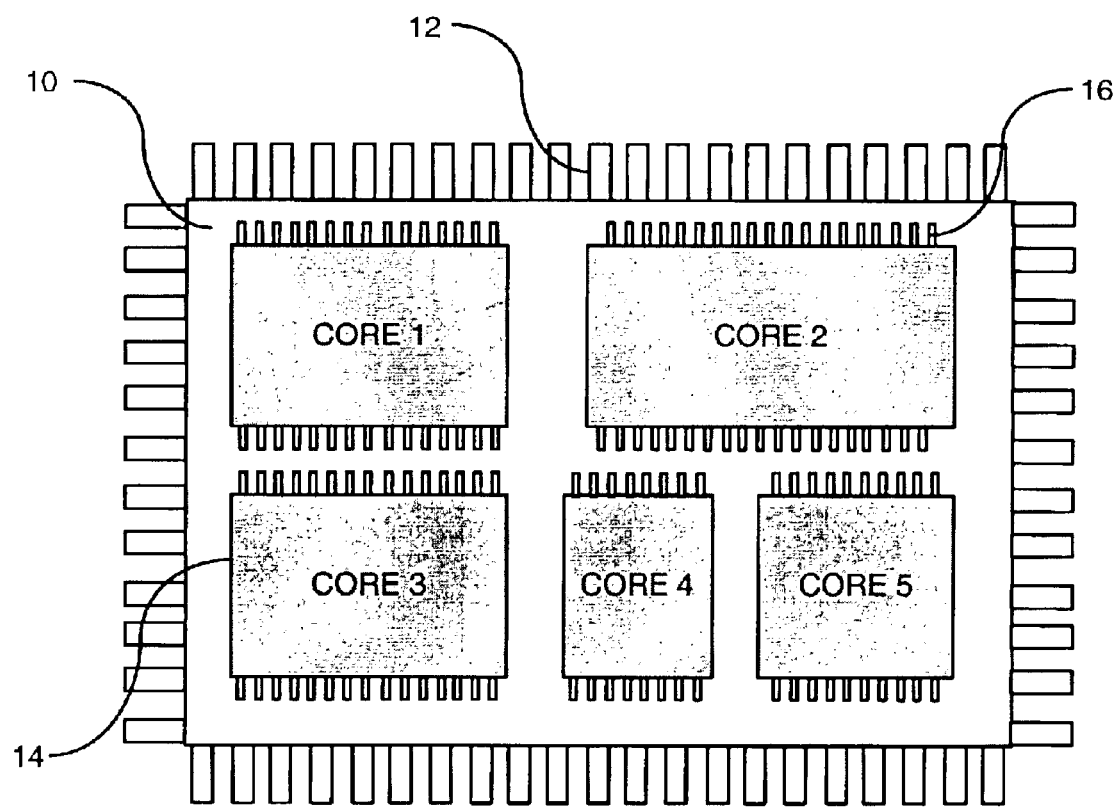
FIG. 1 is a plan view schematically showing a basic SOC containing multiple embedded cores.
Figure 2:
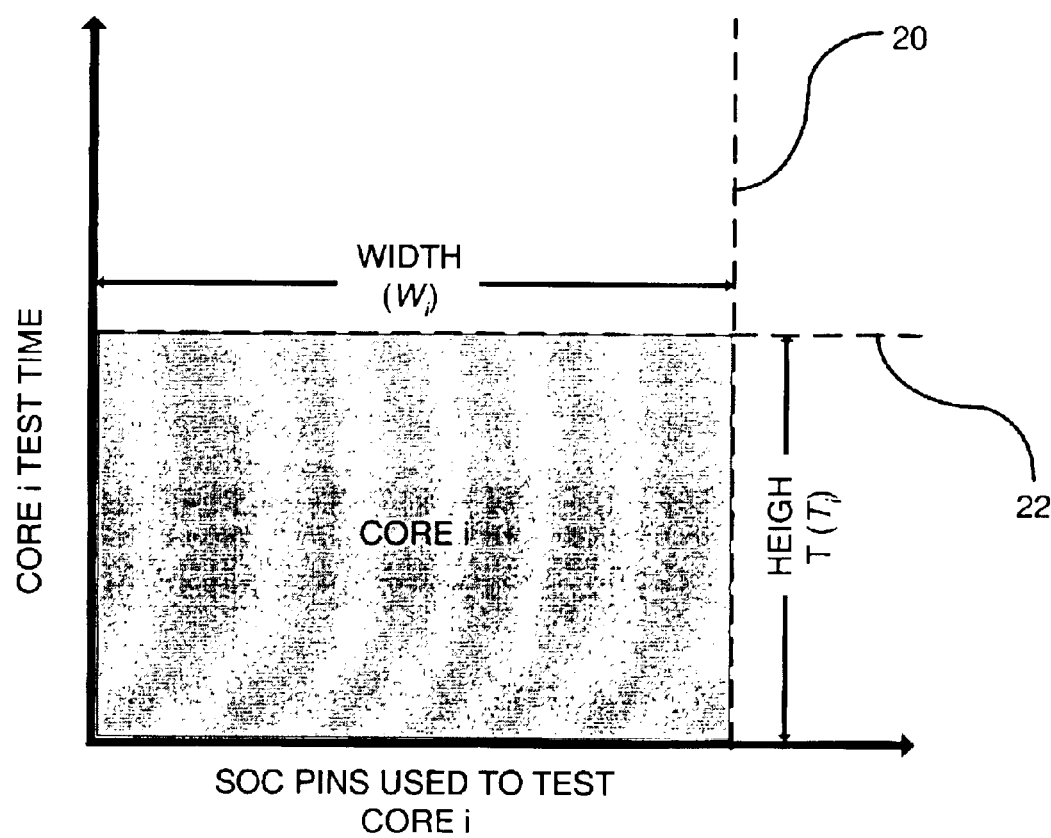
FIG. 2 is an illustration schematically showing a two-dimensional rectangle representing a test of a core.
Figure 3:
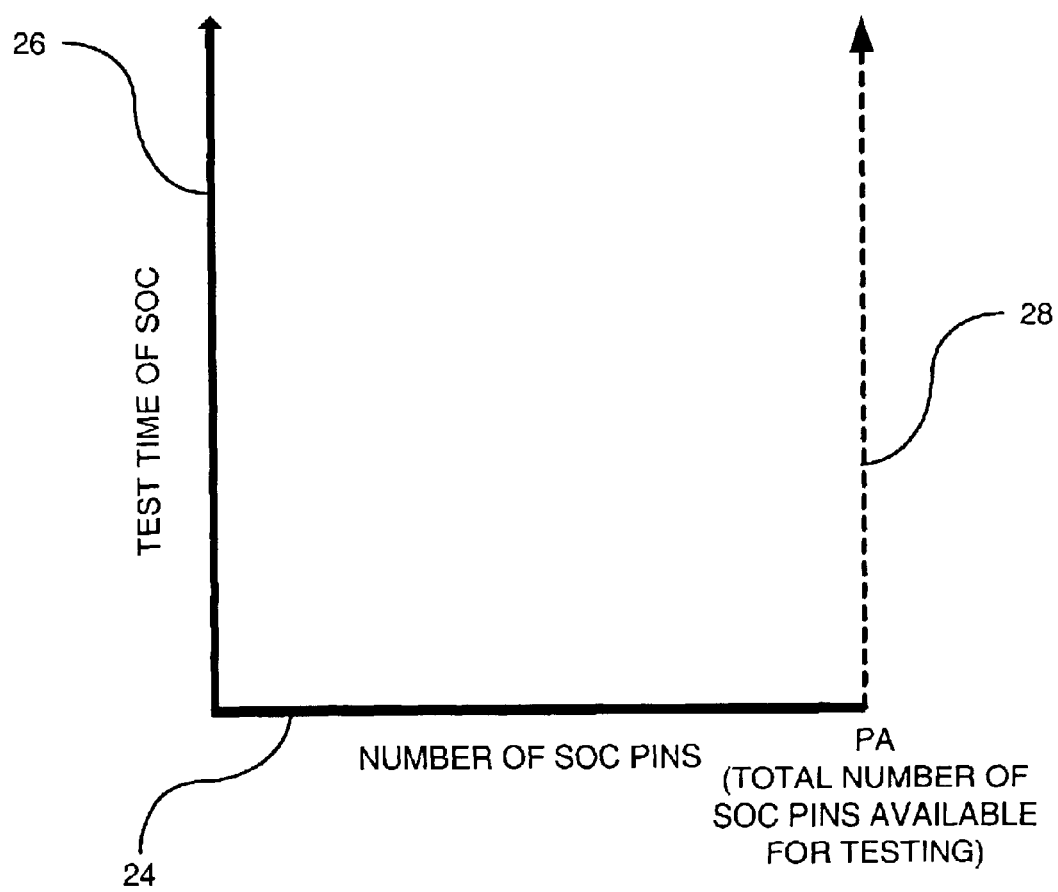
FIG. 3 is an illustration schematically showing a two-dimensional bin representing an SOC test schedule.

In the first representative embodiment, the testing of core $C_i$ is represented as a function of: (1) the number of SOC pins used to test the core; and (2) the time it takes to test the core using that number of SOC pins (the "core test time"). FIG. 2 shows this relationship as a rectangle having a width 20 ($W_i$) corresponding to the pins required to test $C_i$ and a height 22 ($T_i$) corresponding to the core test time. It is understood, however, that this relationship can be shown in any suitable manner. In this embodiment, the testing of the SOC is represented as a two-dimensional bin that is configured to hold or be packed by the rectangles. FIG. 3 is an illustration schematically showing the bin. The bin has a width 24 corresponding to the number of SOC pins and a height 26 corresponding to the SOC test time. In this embodiment, a total number of SOC pins available for testing (PA) is known, thus creating a boundary 28, or upper limit, of the bin that cannot be exceeded. Conceptually, then, the task of scheduling the testing of cores is one of fitting the rectangles into the bin.

Figure 4:
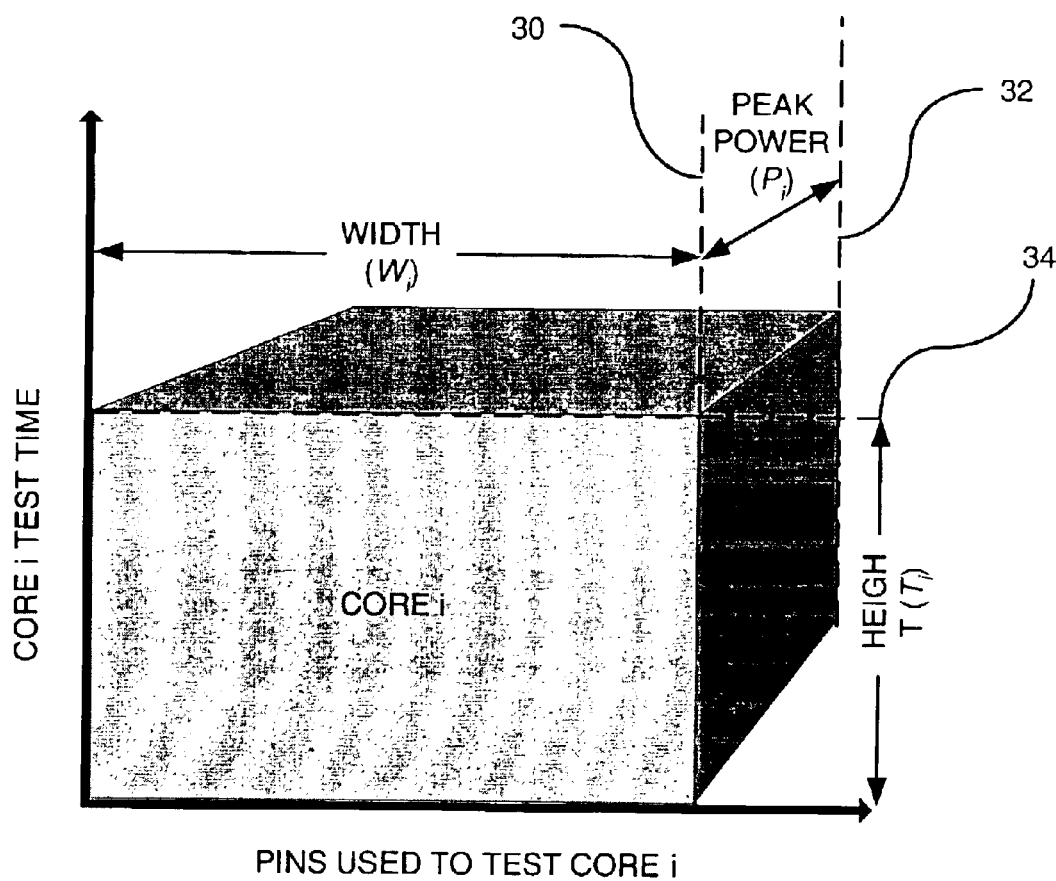
FIG. 4 is an illustration schematically showing a three-dimensional cube representing a test of a core.
Figure 5:
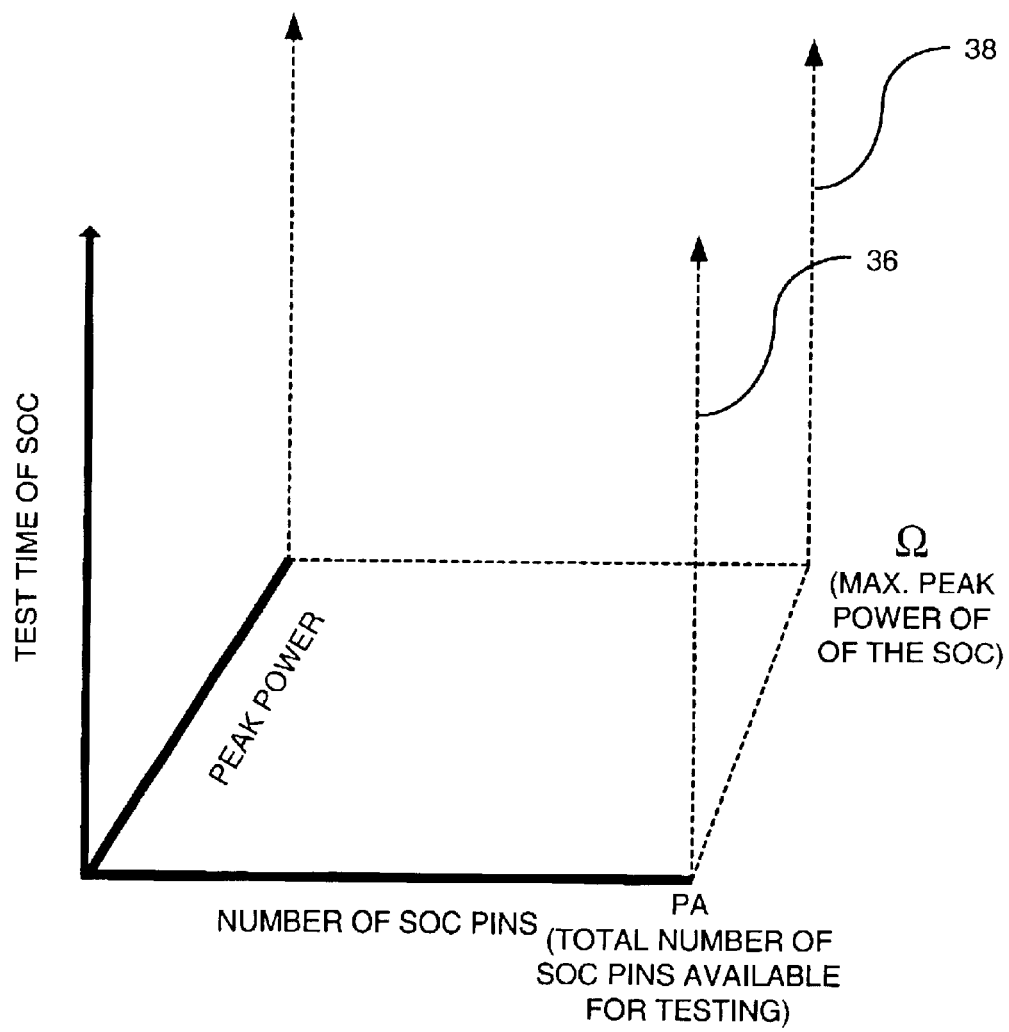
FIG. 5 is an illustration schematically showing a three-dimensional bin representing an SOC test schedule.

In the third representative embodiment, the testing of core $C_i$ is represented as a function of at least: (1) the number of SOC pins used to test the core; (2) the core test time; and (3) the peak power required to test the core. FIG. 4 shows this relationship as a cube having a width 30 ($W_i$) corresponding to the SOC pins used to test $C_i$, a length 32 ($P_i$) corresponding to the peak power required to test the core, and a height 34 ($T_i$) corresponding to the core test time. It is understood, however, that this relationship can be shown in any suitable manner. In this embodiment, the testing of the SOC is represented as a three-dimensional bin that is configured to hold or be packed by the cubes. FIG. 5 is an illustration schematically showing the bin. The bin has a width corresponding to the number of SOC pins, a length corresponding to SOC peak power used during testing, and a height corresponding to the SOC test time. In this embodiment, a total number of SOC pins available for testing (PA) and a maximum peak power of the SOC ($\Omega$) are known, thus forming two respective boundaries 36 and 38, or limits, of the bin. Like the first embodiment, the task of scheduling the testing of cores is conceptually one of fitting the cubes into the bin.

When a core is provided by a manufacturer, a set of test vectors used for a manufacturing test process of the core is typically included. For this set of test vectors, a core test time ($T_i$) is known for a given number of SOC pins used to test the core. Depending on the configuration of the TAM used to access the multiple cores, however, the number of SOC pins used to test a core can be adjusted. An adjustment to the number of SOC pins used to test a core usually results in a corresponding change to the core test time. Therefore, the shape of the rectangle representing the testing of the core can be altered or "transformed" by changing the number of SOC pins used to test the core. This process of adjustment or "transformation" varies depending on whether the core being transformed is a non-scan or scan circuit. Each case is discussed below.

Figure 6:
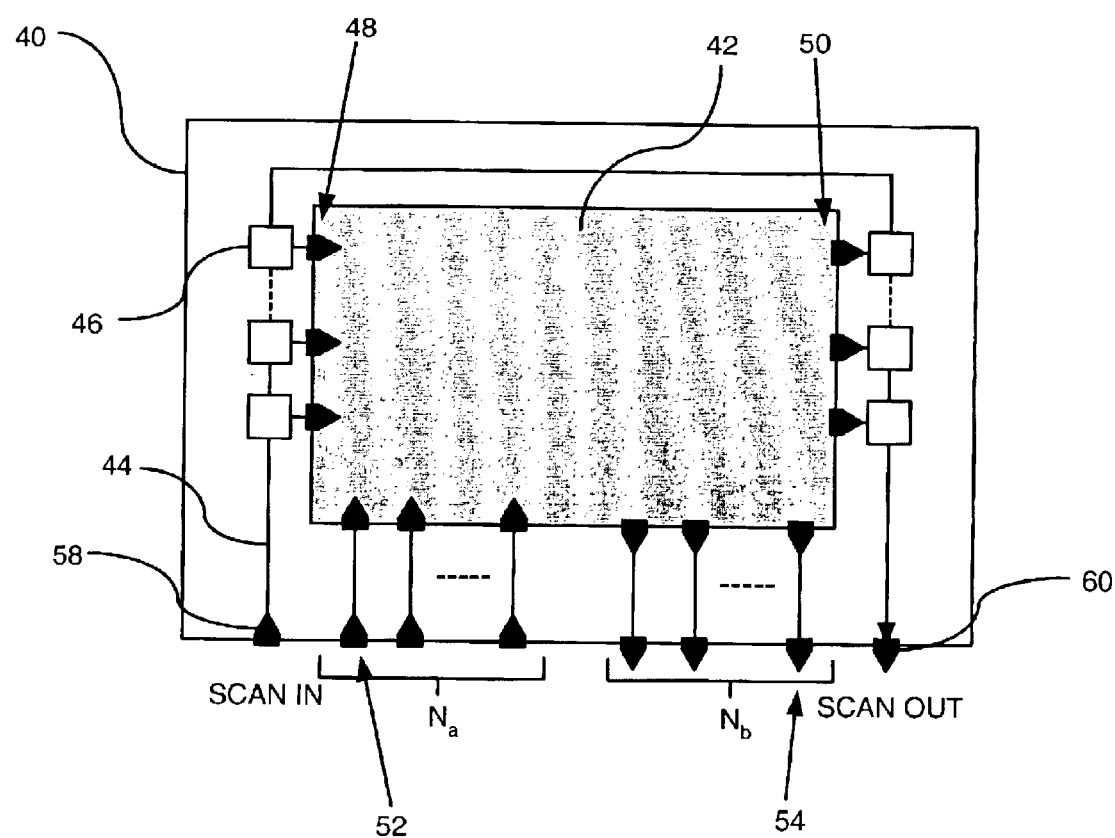
FIG. 6 is a plan view schematically showing a typical non-scan circuit.

FIG. 6 is a plan view schematically showing a typical non-scan circuit. In FIG. 6, core 42 is located within SOC 40. Core 42 has multiple functional pins located at its periphery that are configured as either input pins, shown generally at 48, or output pins, shown generally at 50. Similarly, the SOC 40 has SOC pins that are either input pins, shown generally at 52, or output pins, shown generally at 54. In FIG. 6, parallel access is provided for $N_a$ input SOC pins and $N_b$ output SOC pins. A wrapper scan chain 44 surrounding core 40 provides serial access to the core pins through memory elements 46 connected to respective core pins 48. Although only one wrapper scan chain is shown in FIG. 6, it is understood that multiple wrapper scan chains may be provided. The wrapper scan chain 44 is connected to the SOC by a "scan in" SOC pin 58 and a "scan out" SOC pin 60. As can be seen, once two memory elements 46 of the wrapper scan chain 44 are used, each additional memory element used in the wrapper scan chain results in one less SOC pin being used to test the core. Thus, by varying the number of memory elements in the wrapper scan chain used to access the core pins, the number of SOC pins used to test the core may be altered. Each additional memory element in the wrapper scan chain, however, requires additional time to shift test vectors into and out of the core being tested, thus increasing the core test time. Specifically, the new core test time ($T_{j\_new}$) is found by the following relationship:

$$T_{j\_new} = [1 + \text{Max}(M_j^{in} - N_a, M_j^{out} - N_b)]T_j$$

where $M_j^{in}$ is the total number of input core pins, and $M_j^{out}$ is the total number of output core pins for the core.

Figure 7:
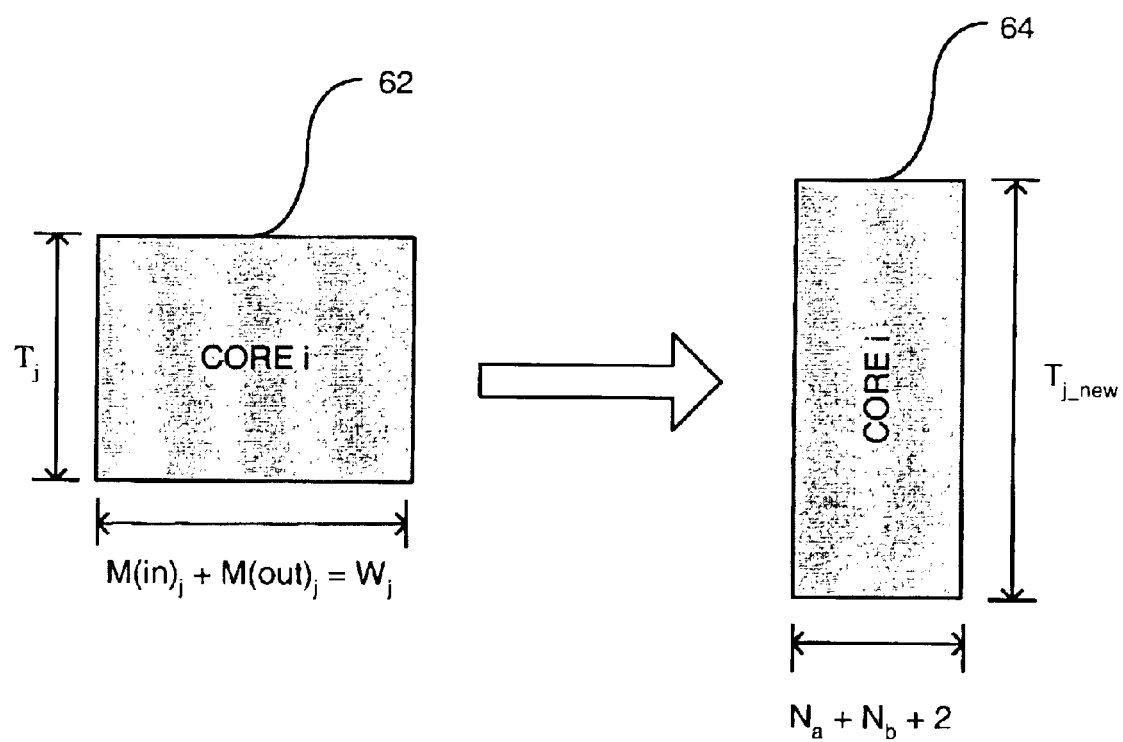
FIG. 7 is an illustration depicting the transformation of a core.

FIG. 7 shows a rectangular representation of a core test before and after a transformation. The transformation may be accomplished by varying the number of memory elements contained in the wrapper scan chain used to access the core pins as described in relation to FIG. 6. Before transformation, it is assumed that parallel access to the core is maximized. Thus, the rectangle 62 has a width equal to $(M_j^{out}+M_j^{in})$ and a height equal to the original core test time $(T_j)$. After transformation, the rectangle 64 has a height corresponding to the new core test time $(T_{j\_new})$ and a reduced width corresponding to the sum of the parallel inputs $N_a$, the parallel outputs $N_b$, and the two SOC pins used to access the wrapper scan chain:

$$W_{j\_new}=N_a+N_b+2$$

Figure 8:
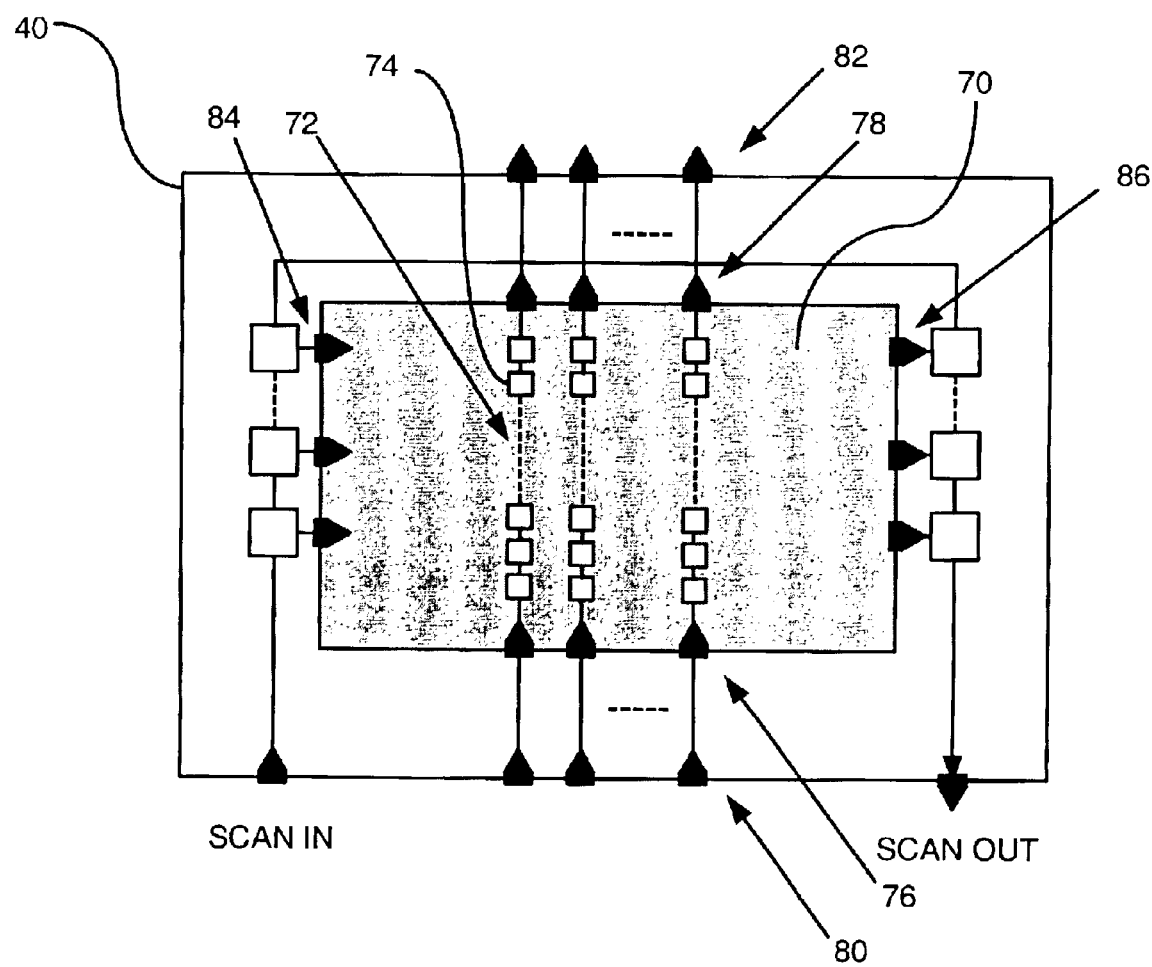
FIG. 8 is a plan view schematically showing a typical scan circuit.

For scan circuits, the process of transformation is more involved. FIG. 8 is a plan view schematically showing a typical scan circuit. The scan circuit 70, located in SOC 40, contains internal scan chains, shown generally at 72. The internal scan chains 72 are used for shifting test vectors into the circuit's memory elements 74 and for shifting the resulting patterns out once the memory elements have captured the test results. The scan chains 72 are accessed by input scan pins, shown generally at 76, and output scan pins, shown generally at 78, which have parallel access to the respective SOC pins 80 and 82. The scan circuit also includes a number of functional input pins $(F_j^{in})$ shown generally at 84, and functional output pins $(F_j^{out})$, shown generally at 86, that do not access any internal scan chains 72, but may be used during the testing of the circuit.

In general, the dimensions of the rectangular representations for scan circuits are dependent on the number of internal scan chains $(S_j)$, the maximum length of the internal scan chain $(L_j)$, and the number of test vectors supplied for the core $(V_j)$. Before transformation, the dimensions of the rectangular representation depend on whether the length of the internal scan chain $(L_j)$ is greater than or less than the length of the wrapper scan chain. If $L_j$ is greater than the length of the wrapper scan chain, then the initial time to test the core $(T_j)$ is $(L_j+1)V_j$, and the initial width $(W_j)$ is $(S_j\times2)+2$. If $L_j$ is less than the length of the wrapper scan chain, then the initial time to test the core $(T_j)$ is equal to $(L_j+1)V_j$, and the initial width $(W_j)$ is equal to $(S_j\times2)+(F_j^{in}-L_j)+(F_j^{out}-L_j)$. For purposes of these calculations, it is assumed that all scan pins of the scan circuit initially have parallel access. It is understood, however, that the principles and formulas discussed could be used to find the initial dimensions for any core configuration, such as the one recommended by the core manufacturer. After transformation, the new test time $(T_{j\_new})$ for $C_j$ is generally dependent on the longest scan chain involved in testing, which may be an internal scan chain or a wrapper scan chain. However, the new test time may also be affected by the total number of functional pins used during testing. Accordingly, there are several different cases concerning different scan circuit configurations for which the new test time $T_{j\_new}$ must be calculated.

For each case discussed, it is assumed that the scan chains of the core are balanced and that a single wrapper scan chain is used to provide serial access. It is understood, however, that additional wrapper scan chains could be used to further reduce the core test time according to the principles and formulas discussed below. It is also assumed that the internal scan chains operate in only the two most basic submodes: scan and capture. It is understood, however, that the principles and formulas discussed below could be modified to apply to scan chains that operate in other submodes. It is further assumed that the transformation is performed to utilize all of the parallel access SOC pins $(N_j)$ available and the wrapper scan chain. Thus, the new width of the rectangle for all cases discussed below is:

$$W_{j\_new}=N_j+2$$

It is understood, however, that the principles and formulas discussed below could be used to find the core test times for various other transformations. For the first five cases, the number of parallel access SOC pins $N_j$ exceeds the number of scan pins, (i.e., $N_j>(S_j\times2)$). Accordingly, there exist $A_j$ additional parallel access SOC pins that can be allocated to functional pins where $A_j$ is equal to $N_j-(S_j\times2)$.

In the first case, the length of the longest internal scan chain is larger than (or equal to) the number of the functional input pins but smaller than the number of the functional output pins. In this case, all additional parallel access SOC pins $(A_j)$ are allocated to the functional outputs. There are still $F_j^{out}-A_j$ outputs pins that have to be serially accessed. The shifting time is therefore determined by $Max(L_j, F_j^{out}-A_j)$. Thus, the new core test times is:

$$T_{j\_new}=[Max(L_j, F_j^{out}-A_j)+1]Vj.$$

In the second case, the length of the longest internal scan chain is larger than (or equal to) the number of the functional output pins but smaller than the number of the functional input pins. Following the same logic as the first case, the new core test time is:

$$T_{j\_new}=[Max(L_j,F_j^{in}-A_j)+1]Vj.$$

In the third case, the length of the longest internal scan chain is less than both the functional input pin count and the functional output pin count. In this case, the additional parallel access SOC pins $A_j$ need to be distributed to the functional pins. $B_j$ is defined as the absolute value of the difference between the number of functional input and output pins (i.e., $B_j=|F_j^{in}-F_j^{out}|$). In this case, it is assumed that $B_j$ is less then $A_j$. $B_j$ parallel access SOC pins are assigned to the larger of the number of functional inputs or output pins. The remaining parallel access SOC pins $(A_j-B_j)$ are then allocated evenly to the functional input and output pins. At this time, the number of functional input and output pins having serial access are equal and can be calculated by the following equation:

$$\min(F_j^{in}, F_j^{out})-\lfloor(A_j-B_j)/2\rfloor$$

The shifting time is then determined by:

$$\max(L_j, \min(F_j^{in}, F_j^{out})-\lfloor(A_j-B_j)/2\rfloor)$$

Therefore:

$$T_{j\_new}=[\max(L_j, \min(F_j^{in}, F_j^{out})-\lfloor(A_j-B_j)/2\rfloor)+1]V_j$$

In the fourth case, like the third case, the length of the longest internal scan chain is less than both the functional input pin count and the functional output pin count. Again, the $A_j$ additional SOC pins need to be distributed to the functional pins for parallel access. Here, however, the absolute value of the difference between the number of functional inputs and outputs $B_j$ is assumed to be larger than (or equal to) $A_j$ (i.e., $|F_j^{in}-F_j^{out}|\geq A_j$). All $A_j$ parallel access SOC pins may then be assigned to the larger of the number of functional inputs or outputs. After assignment, if $F_j^{in}>F_j^{out}$, there are $F_j^{in}-A_j$ inputs remaining that need to be serially accessed, or if $F_j^{out}>F_j^{in}$, there are $F_j^{out}-A_j$, outputs remaining that need to be serially accessed. Because $|F_j^{in}-F_j^{out}|\geq A_j$, the functional input and output pins that have serial access can be determined by $Max(F_j^{in}, F_j^{out})-A_j$, which must be larger than $L_j$. Therefore:

$$T_{j\_new}=[Max(F_j^{in}, F_j^{out})-A_j+1]V_j.$$

In the fifth case, the longest internal scan chain is greater than the total number of functional inputs and outputs (i.e., $L_j>(F_j^{in}+F_j^{out})$), In this case, the core test time depends on the number of scan chain pins in the core that have direct access from the SOC. If the number of core pins that have parallel access is greater than the number of scan pins (i.e., if $N_j>(2\times S_j)$), then the maximum length of the internal scan chains controls the core test time. This results from the fact that test patterns are shifted into the internal scan chain simultaneously with the patterns being shifted into the wrapper scan chain. Therefore, the new core test time is the same as the original core test time:

$$T_{j\_new}=T_j=(L_j+1)V_j$$

If the number of core pins that have parallel access is less than the number of scan pins (i.e., if $N_j<(2\times S_j)$), then the calculation for core test time becomes more complicated. Under these circumstances, some of the scan pins have to be accessed serially. This is done by concatenating the internal scan chains. For instance, the internal scan chains that do not have parallel access can first be concatenated to form a long scan chain. The long scan chain can then be concatenated with the wrapper scan chain. This leads to a substantial increase in the test application time. It is understood that this method could be improved by balancing the internal scan chains so that the internal scan chains that do not have parallel access are distributed and concatenated with scan chains that have parallel access. Assuming that $SC_j$ scan chains would need to be serially accessed due to pin restrictions in the SOC, the time taken to apply all the $V_j$ test vectors to the core is calculated as follows:

$$T_{j\_new}=(SC_j\times L_j)+\text{Max}(F_j^{in}, F_j^{out})$$

Figure 9:
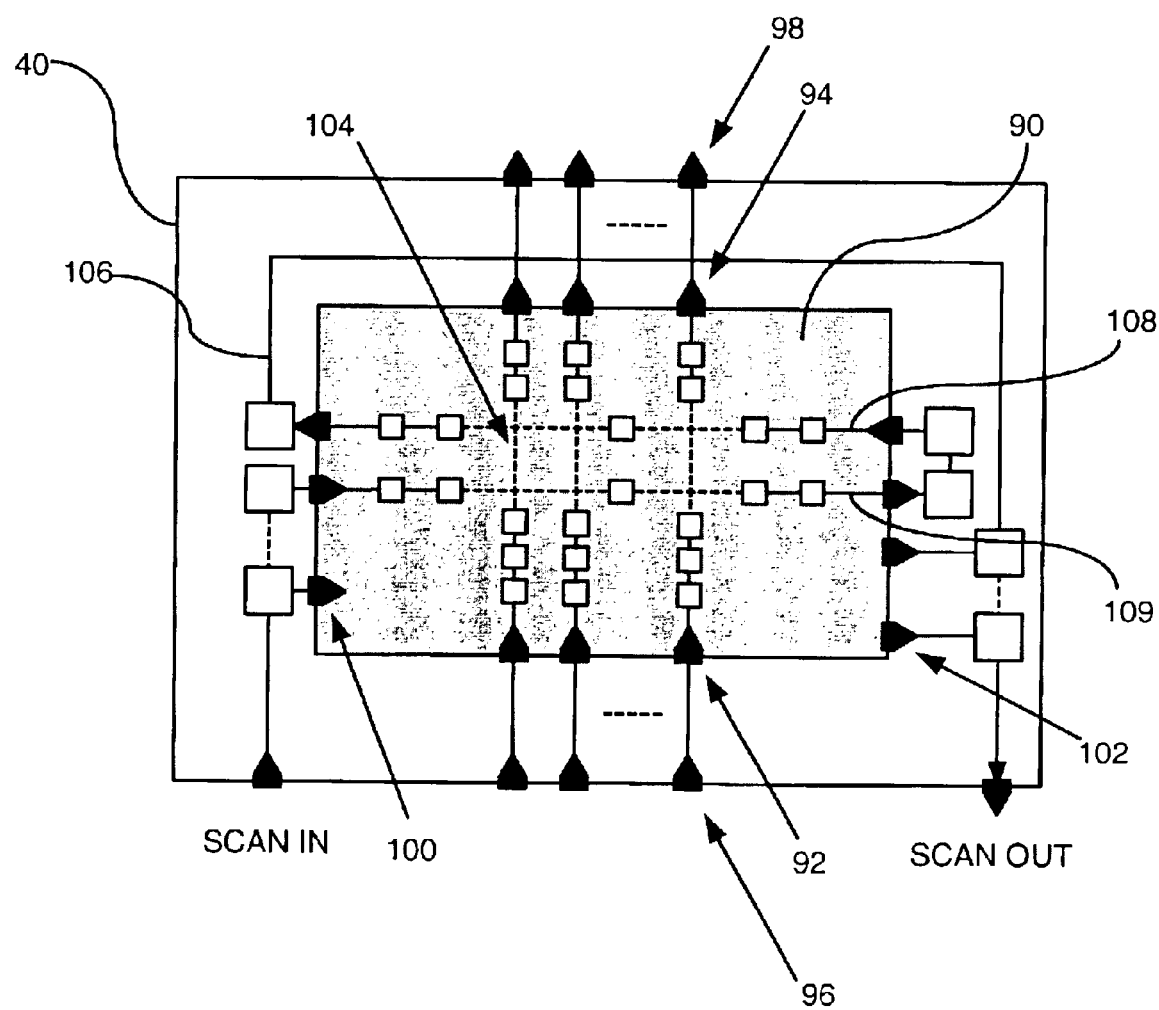
FIG. 9 is a plan view schematically showing a scan circuit having internal scan chains that are concatenated.

FIG. 9 illustrates the fifth case. FIG. 9 shows a scan circuit 90 embedded in an SOC 40. The number of core pins having parallel access, shown generally at 92 and 94, is less than the number of input and output scan pins, shown generally at 96 and 98. Additionally, the number of functional pins 100 and 102 is less than the length of the internal scan chains, shown generally at 104. Therefore, in the example shown, two of the internal scan chains (108 and 109) have been concatenated and linked with the wrapper scan chain 106.

In the sixth case, all scan pins have parallel access, and all functional pins have serial access from SOC. The test time is determined by the longest scan chain, which may be an internal scan chain or wrapper scan chain. Specifically:

$$T_{j\_new}=\text{Max}(F_j^{in}, F_j^{out}, L_j)$$

In the seventh case, test resources are severely limited such that parallel and serial access cannot be performed together. In this case, it is typical for no transformation to be performed. If the core has more core pins than the SOC pins available for testing, the internal scan chains of the core may have to be concatenated with one another so that the core pins can be serially accessed using two SOC pins. Additionally, an independent test may have to be scheduled.

First Representative Embodiment

A first representative embodiment formulates the task of scheduling the concurrent testing of cores as a two-dimensional bin-packing problem and uses a modified version of a known bin-packing heuristic to perform the scheduling.

Figure 10:
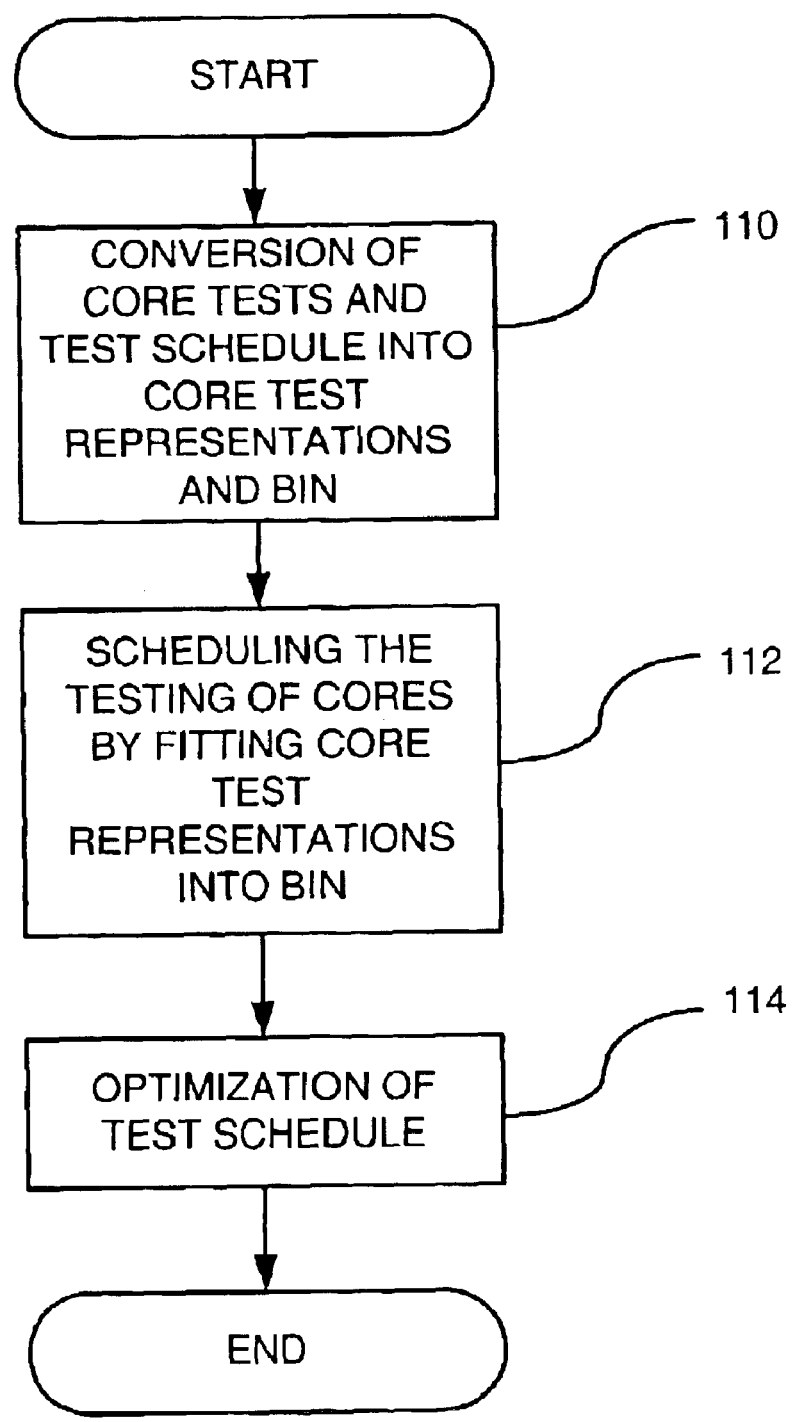
FIG. 10 is a flowchart outlining the overall methodology of the representative embodiments.

FIG. 10 is a flowchart showing the overall methodology employed in the first embodiment. First, in process block 110, the testing of each core is converted into a multi-dimensional core test representation and the SOC test schedule is converted into a multi-dimensional bin capable of receiving the core test representations. Second, in process block 112, a test schedule is created by fitting the multiple core test representations into the bin. Third, in process block 114, the test schedule is optimized by searching for and utilizing unused space in the bin.

Figure 11:
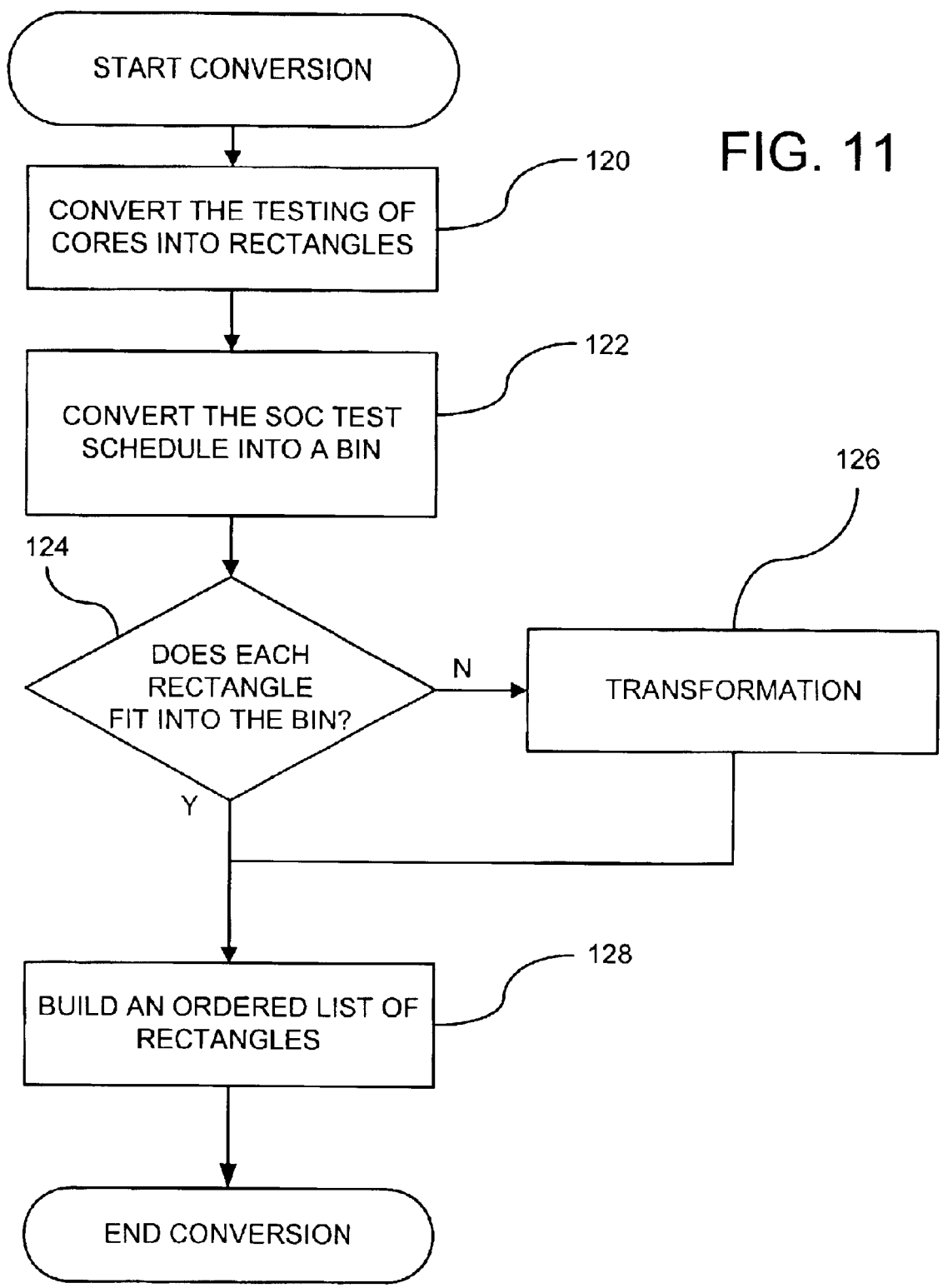
FIG. 11 is a flowchart of the core conversion and ordering procedure used in a first representative embodiment.
Figure 12:
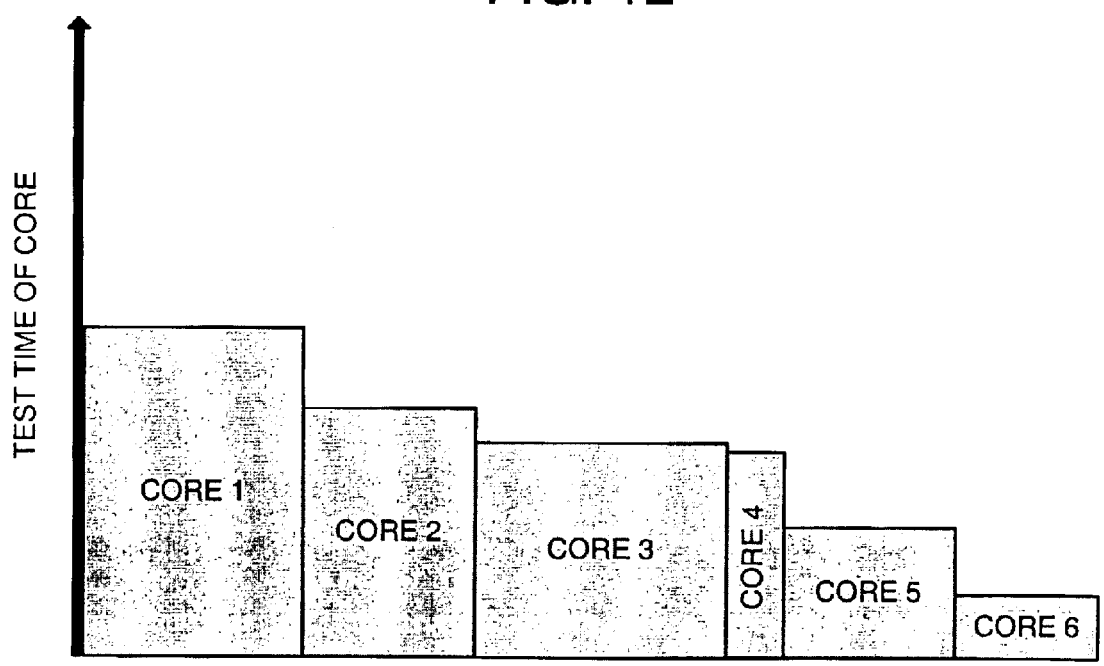
FIG. 12 is an illustration of the core conversion and ordering procedure used in the first representative embodiment.

FIG. 11 is a flowchart showing the various procedures involved with process block 110 of FIG. 10 where the core tests and the test schedule are converted into core test representations and a bin. First, in process block 120, the various cores embedded in the SOC are converted into rectangles that represent the testing of the core. As noted above, the rectangles in this embodiment have a width ($W_i$) corresponding to the SOC pins available for testing core $C_i$ and a height ($T_i$) corresponding to the core test time. This initial conversion is typically performed according to the testing configuration suggested by the core provider. However, the conversion may be done assuming other circuit configurations. Next, in process block 122, the testing schedule of the SOC is converted into a two-dimensional bin. In this embodiment, the bin has a width representing the number of SOC pins and a height representing the SOC test time. In this embodiment, a total number of SOC pins available for testing (PA) is known, thus creating a boundary, or upper limit, of the bin that should not be exceeded. Next, in process block 124, each rectangle is checked to determine whether it fits into the bin. It is possible that for some cores, the initial number of SOC pins used to test the core exceeds the total number of SOC pins available for testing. In this case, the test resources are limited and proper access to the core is impossible without transformation of the core. Conceptually, this situation occurs when a rectangle has a width that exceeds the width of the empty bin. If such a rectangle is found, a transformation is performed in process block 126 to reduce the width of the rectangle such that it fits into the bin (i.e., the number of SOC pins used to test the core is reduced such that the available test resources may be used to test the core). This transformation is performed according to the transformation methods described above and reduces the number of the SOC pins used to test the core to the total number of SOC pins available for testing (PA). After any necessary transformations have been performed, or after it is determined that no transformations are necessary, the rectangles are ordered into a list in process block 128. The list is compiled according to the height of the rectangles (i.e., the core test time), beginning with the rectangle of the greatest height and ending with the rectangle of the lowest height. FIG. 12 is an illustration showing the ordered list of six exemplary rectangles as compiled and ordered by the conversion procedure outlined in FIG. 11.

Figure 13:
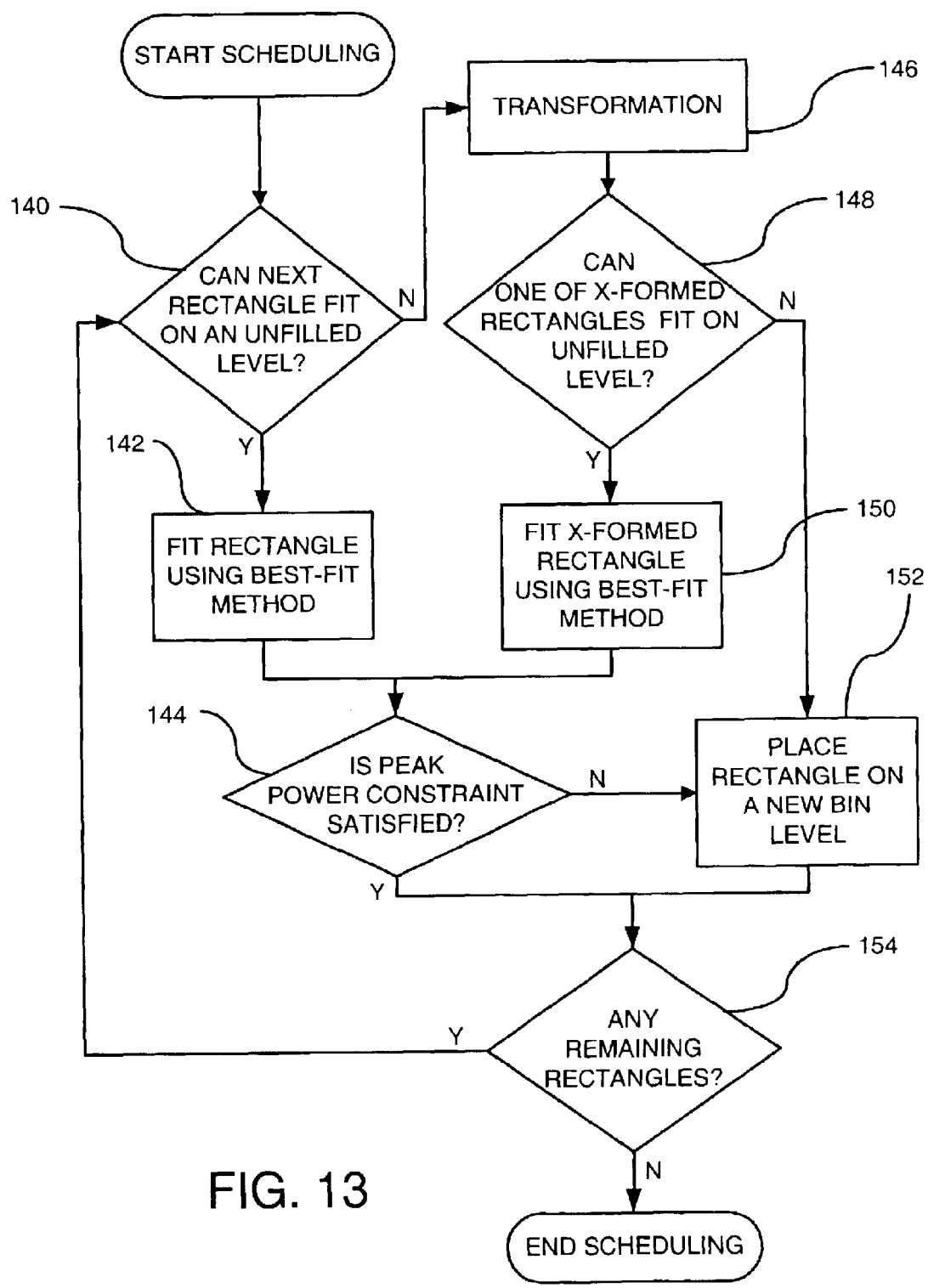
FIG. 13 is a flowchart of the scheduling procedure used in the first representative embodiment.

FIG. 13 is a flowchart showing the various procedures involved with process block 112 of FIG. 10 where the testing of cores is scheduled by fitting the core test representations into the bin. In this embodiment, fitting the core test representations into the bin also involves minimizing the height of the "packed" rectangles. During the process, the bin may be divided into multiple bin levels, which correspond to different testing sessions of the SOC. The height of a given bin level may be dictated by the height of the first rectangle placed onto the bin level, which is also the rectangle on the level having the greatest core test time. During the scheduling process, the height of a bin level may not be exceeded by any other rectangle fit onto the level. The scheduling process is performed for each rectangle in the order of the list generated at process block 128 of FIG. 11, beginning with the rectangle of greatest height (i.e., the core having the greatest core test time).

First, in process block 140, a determination is made for the next rectangle on the list as to whether the rectangle fits onto any unfilled bin level. If it is determined that a rectangle fits onto at least one bin level, the rectangle is fit in process block 142 onto a bin level using a best-fit method. The best-fit method first determines if the rectangle fits on multiple bin levels. If the rectangle is determined to fit onto multiple bin levels, then the best-fit method fits the rectangle onto the bin level having the minimum unused width after the rectangle is placed (i.e., the bin level having the fewest unused SOC pins after the rectangle has been placed in the bin). If the rectangle is determined to fit onto only one level, then the best-fit method fits the rectangle onto the one available level.

If it is determined that a rectangle does not fit into any unfilled bin level, then, in process block 146, a transformation is performed on the rectangle for each unfilled level such that all of the unused width of each respective level is allocated to the rectangle. Thus, the transformation converts the rectangle into one that fits the available bin width for each unfilled bin level. Then, in process block 148, a determination is made for each transformed rectangle as to whether the transformed rectangle fits onto the respective bin level for which it was transformed. A rectangle is deemed not to fit on the respective bin level, however, if its height exceeds the height of the bin level. If at least one of the transformed rectangles can be fit onto its respective unfilled bin level, the rectangle is fit in process block 150 according to the best-fit method described above. If none of the transformed rectangles fit onto their respective unfilled bin levels, then the rectangle is fit onto a new bin level in process block 152.

Once a rectangle or transformed rectangle has been fit onto an unfilled bin level, a determination is made in process block 144 as to whether the testing of that level can be performed without exceeding the maximum peak power of the SOC. In other words, the bin level is checked to ensure that the peak power constraint is satisfied. If the peak power constraint is not satisfied, then, in process block 152, the original rectangle from the ordered list (not the transformed rectangle) is fit onto a new bin level.

Finally, a determination is made in process block 154 as to whether there exist any additional rectangles from the ordered list that need to be fit into the bin. If so, the scheduling procedure is repeated for the next rectangle in the list. Otherwise, the scheduling procedure (process block 112 of FIG. 10) ends.

Figure 14:
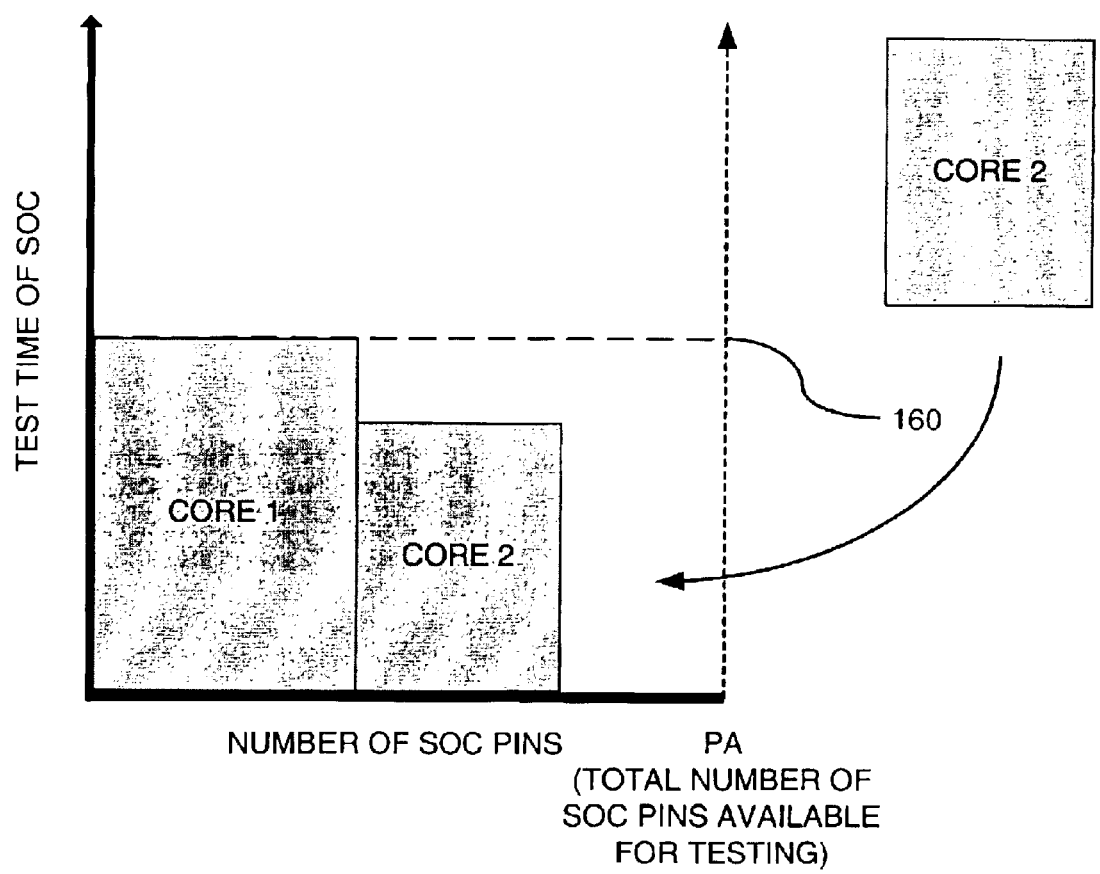
FIG. 14 is a first illustration of the scheduling procedure used in the first representative embodiment.

FIGS. 14–18 illustrate the scheduling procedure using the exemplary cores depicted in FIG. 12. In FIG. 14, the core 1 rectangle has already been fit onto the first level. The core 1 rectangle was fit onto the first bin level because it was the only existing bin level and was unfilled. Further, because the core 1 rectangle was the first rectangle placed on the level, a first bin level height 160 was established. The core 2 rectangle, the next rectangle in the ordered list, is then fit. Because the core 2 rectangle fits onto the unfilled first bin level, it is placed next to the core 1 rectangle.

Figure 15:
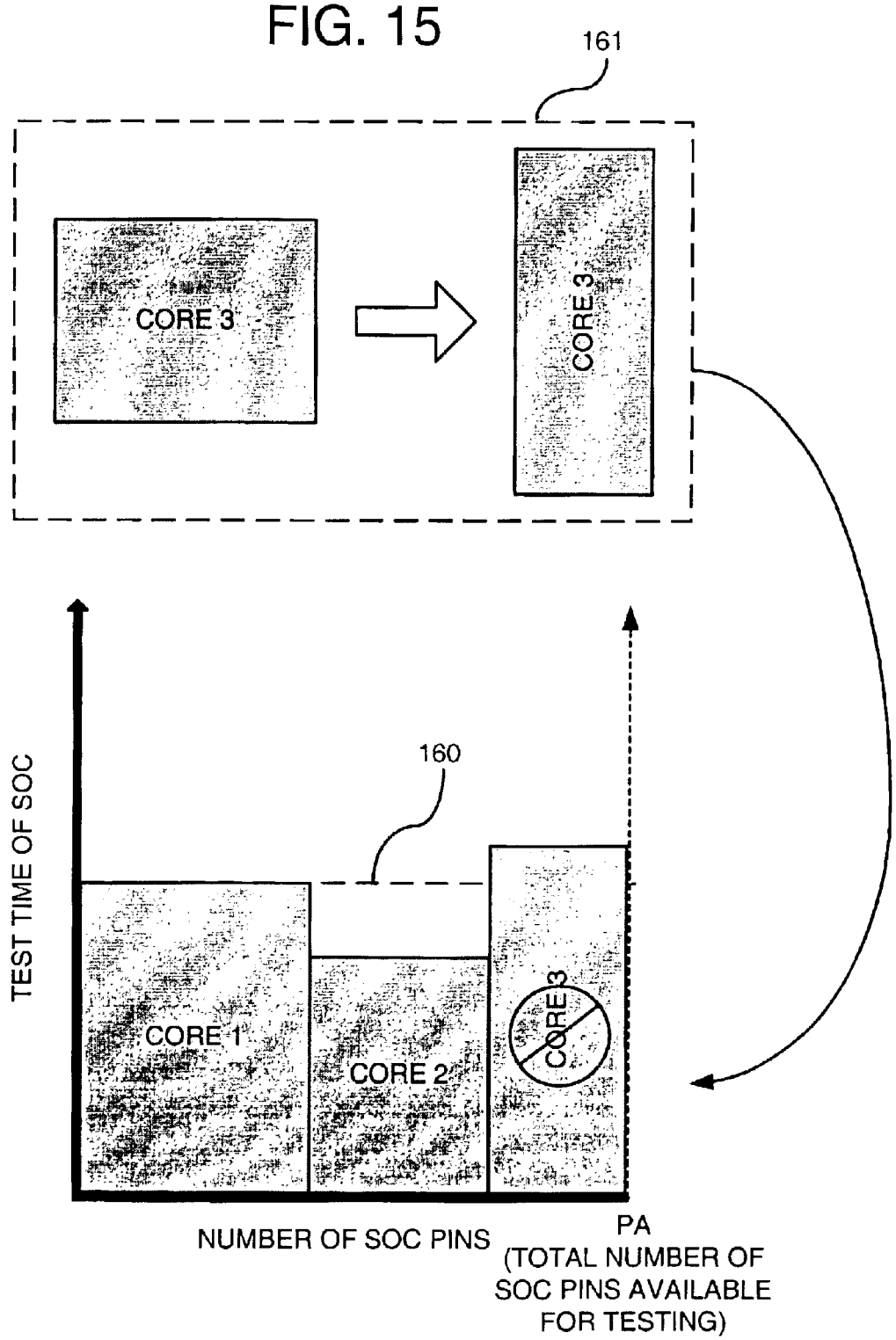
FIG. 15 is a second illustration of the scheduling procedure used in the first representative embodiment.

Next, in FIG. 15, the core 3 rectangle is fit. The core 3 rectangle, however, has a width that does not fit the unused width of the unfilled first bin level. According to process block 146 of FIG. 13, a transformation is performed (as is shown at 161) such that the width of the rectangle is modified to fit the unused width of the first bin level. After transformation, a determination is made in process block 148 of FIG. 13 as to whether the transformed core can fit onto an unfilled bin level. In this case, the transformed rectangle has a height that exceeds the first bin level height 160. Thus, the rectangle cannot be fit onto the bin level.

Figure 16:
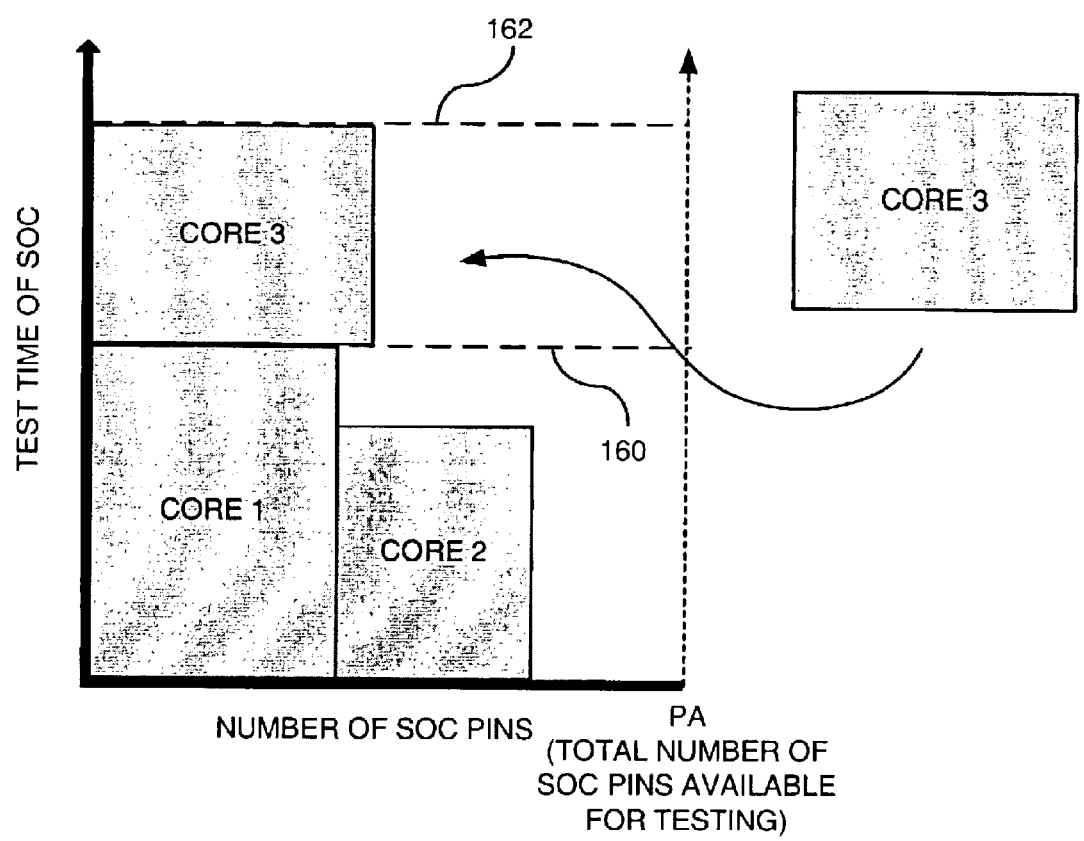
FIG. 16 is a third illustration of the scheduling procedure used in the first representative embodiment.

In this situation, and as illustrated by FIG. 16, process block 152 of FIG. 13 fits the original (i.e., untransformed) core 3 rectangle from the ordered list onto a new bin level, thereby establishing a second bin level height 162.

Figure 17:
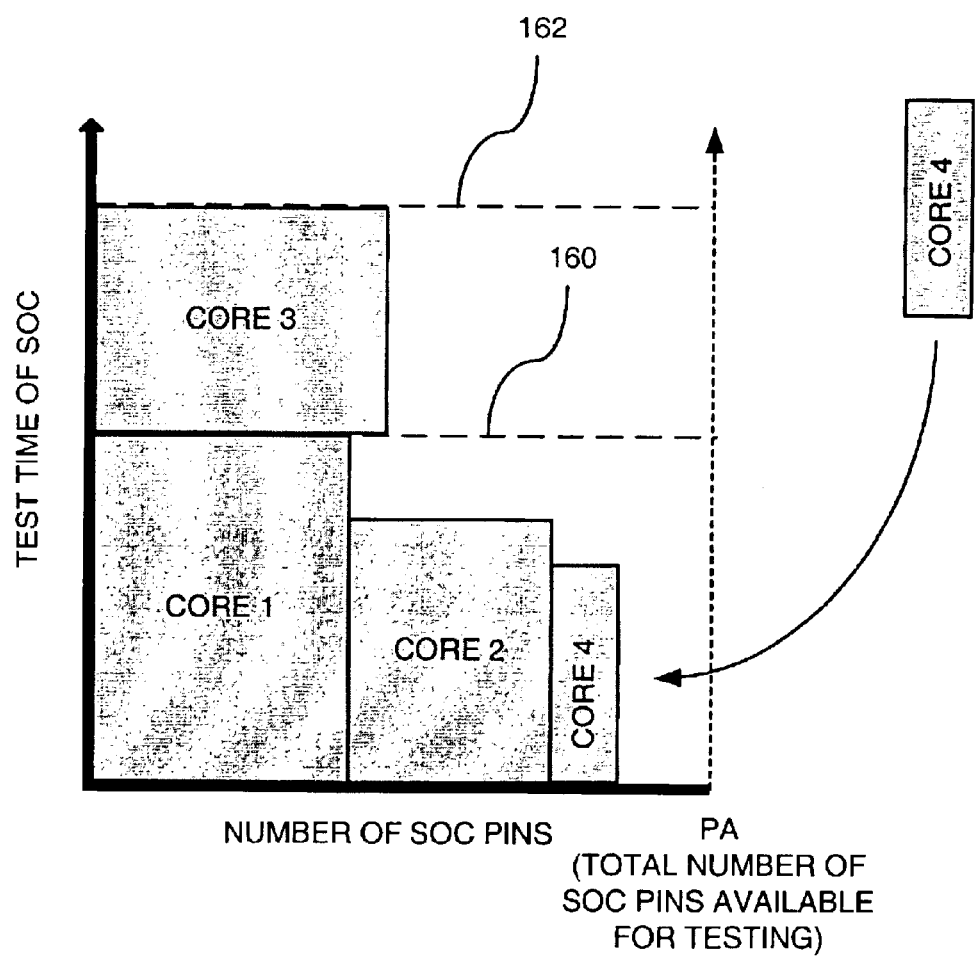
FIG. 17 is a fourth illustration of the scheduling procedure used in the first representative embodiment.

As illustrated by FIG. 17, the core 4 rectangle is then fit. The core 4 rectangle fits onto both the unfilled first and second bin levels. According to process block 142 of FIG. 13, a best-fit method is used to place the rectangle. The best-fit method provides that whenever a rectangle fits onto multiple unfilled bin levels, the rectangle should be fit onto the level having the minimum amount of unused width after the rectangle is placed (i.e., the bin level having the fewest number of unused SOC pins after the rectangle has been placed in the bin). In this case, the first bin level has the minimum unused width, and the core 4 rectangle is placed accordingly.

Figure 18:
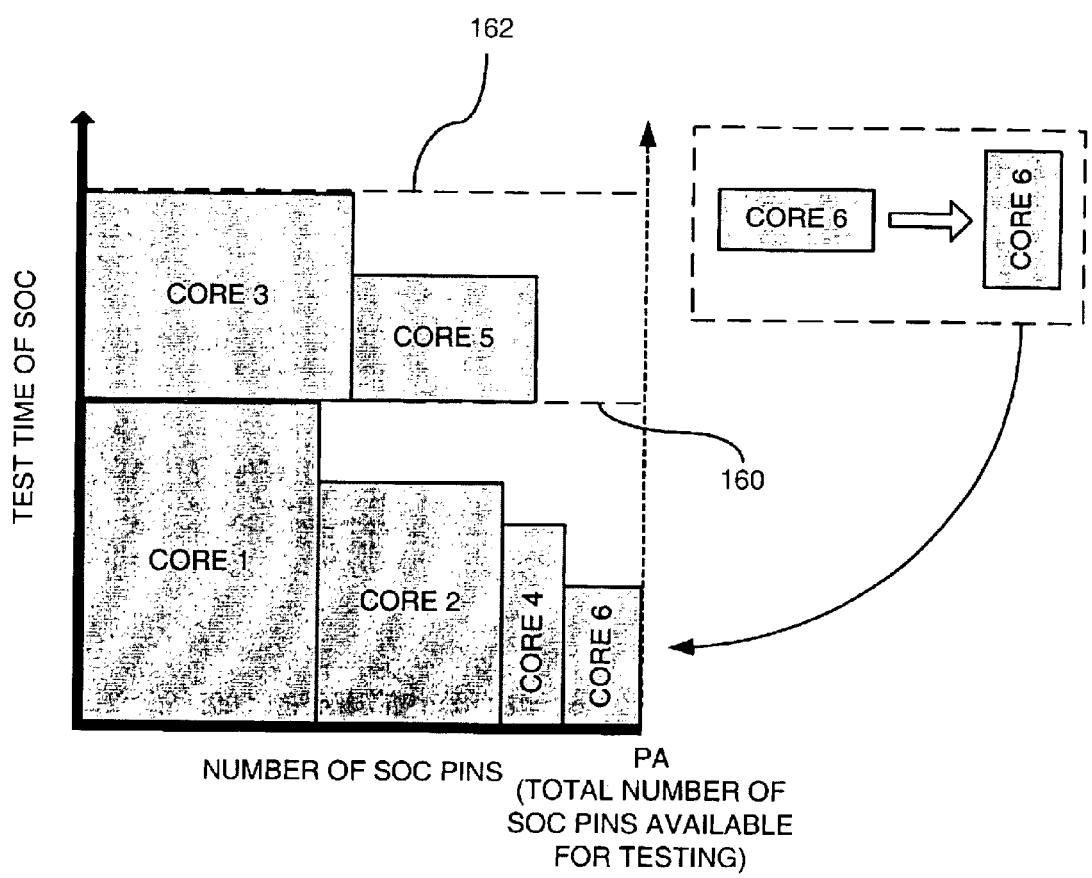
FIG. 18 is a fifth illustration of the scheduling procedure used in the first representative embodiment.

As shown in FIG. 18, the core 5 rectangle is then fit. The core 5 rectangle fits onto only one unfilled bin level, the second bin level. According to the best-fit method in process block 142 of FIG. 13, the rectangle is placed on this level. The core 6 rectangle, the last in the list, is then fit. Originally, the core 6 rectangle does not fit onto any of the unfilled bin levels. Therefore, according to process block 146 of FIG. 13, a transformation is performed. After transformation, the core 6 representation fits onto both of the unfilled first and second levels. Thus, the best-fit method in process block 150 of FIG. 13 is used to place the rectangle. According to the best-fit method, the transformed rectangle is placed on the first bin level, which has the minimum amount of unused bin width. After the core 6 representation is placed, the scheduling procedure (process block 112 in FIG. 10) is complete.

Figure 19:
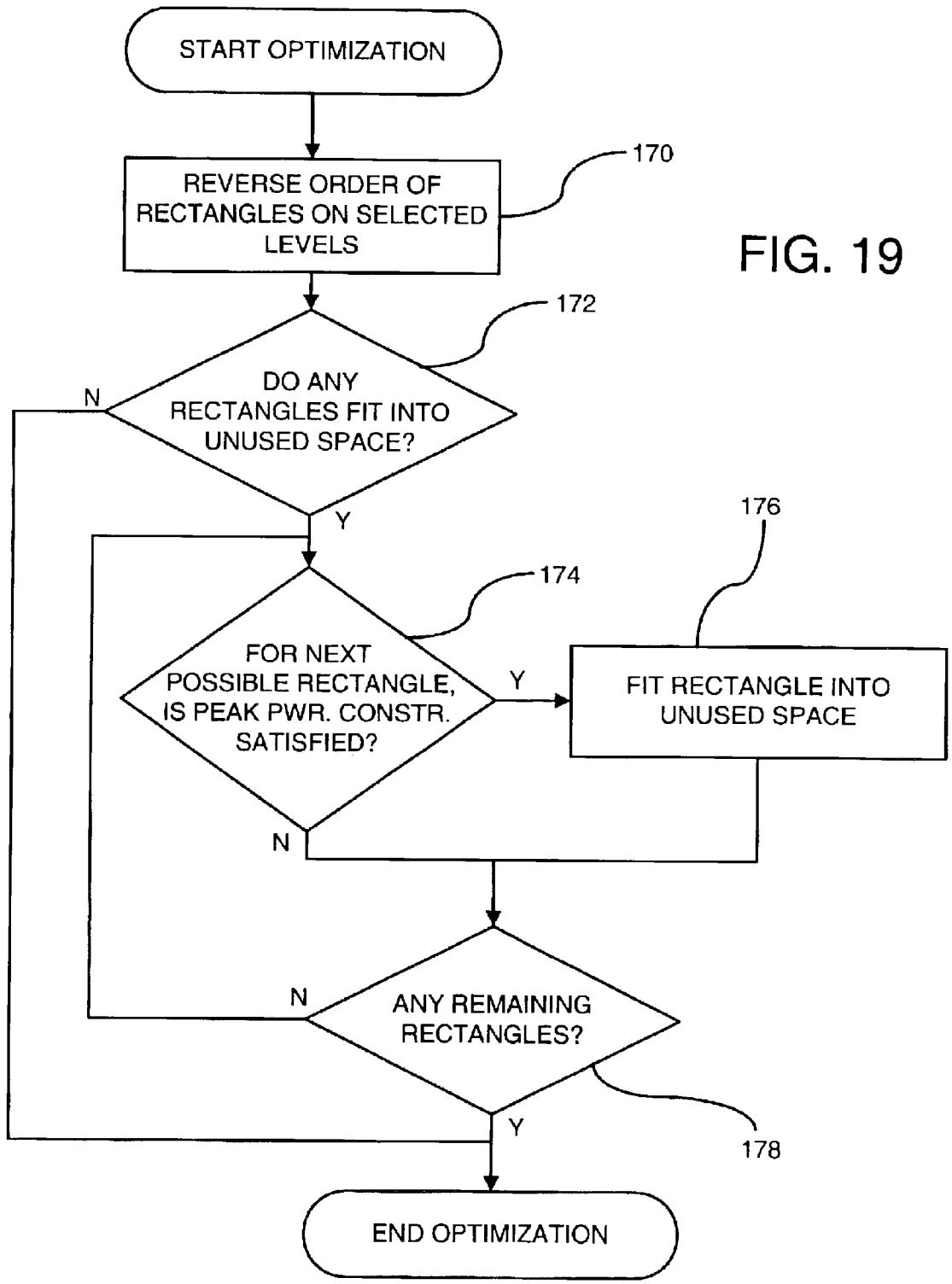
FIG. 19 is a flowchart of the test schedule optimization procedure used in the first representative embodiment.

FIG. 19 is a flowchart showing the various procedures involved with process block 114 of FIG. 10 where the test schedule is optimized. Generally, optimization of the test schedule is performed to determine whether any unused time in the various bin levels may be utilized and shared to further reduce the core testing time. In process block 170, test schedule optimization first reverses the order in which the cores are placed in selected bin levels. In one alternative embodiment, every other bin level starting with the second level is reversed. Next, in process block 172, a determination is made as to whether any of the rectangles of the reversed levels can be fit into unused space of the previous level. If no rectangles can be fit, then test schedule optimization ends. But if it is determined that unused space of the previous level can be utilized, a determination is made in process block 174 as to whether the peak power constraint is satisfied for the next of the possible rectangles that can be fit into the unused space. If no peak power problem is detected, then the rectangle is fit into the unused space in process block 176, thus resulting in the sharing of time between the levels. Then, a determination is made in process block 178 as to whether there are any remaining possible rectangles to be considered for the unused space. If there are possible rectangles remaining, then the peak power constraint is checked for the next of the possible rectangles in process block 174. Otherwise, test schedule optimization ends.

Figure 20:
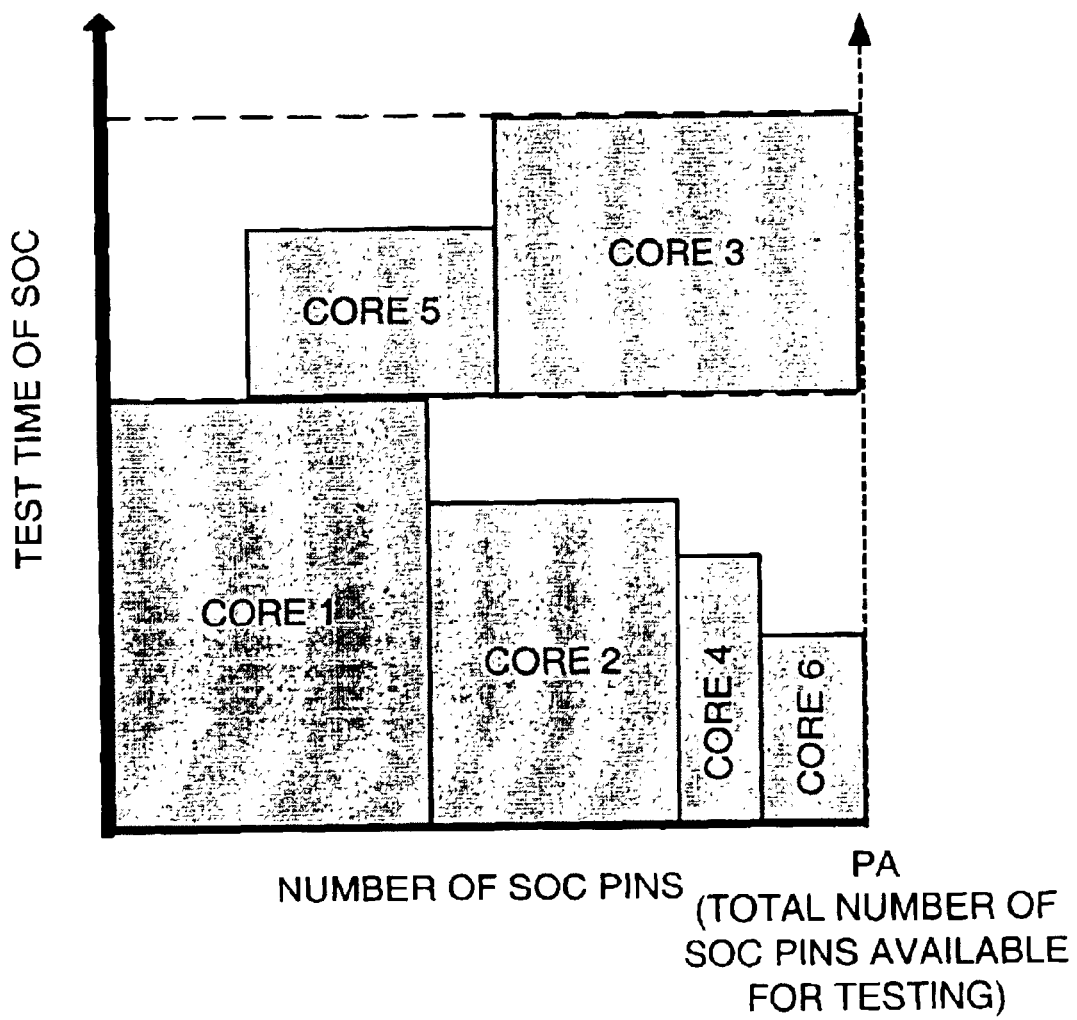
FIG. 20 is a first illustration of the test schedule optimization procedure used in the first representative embodiment.
Figure 21:
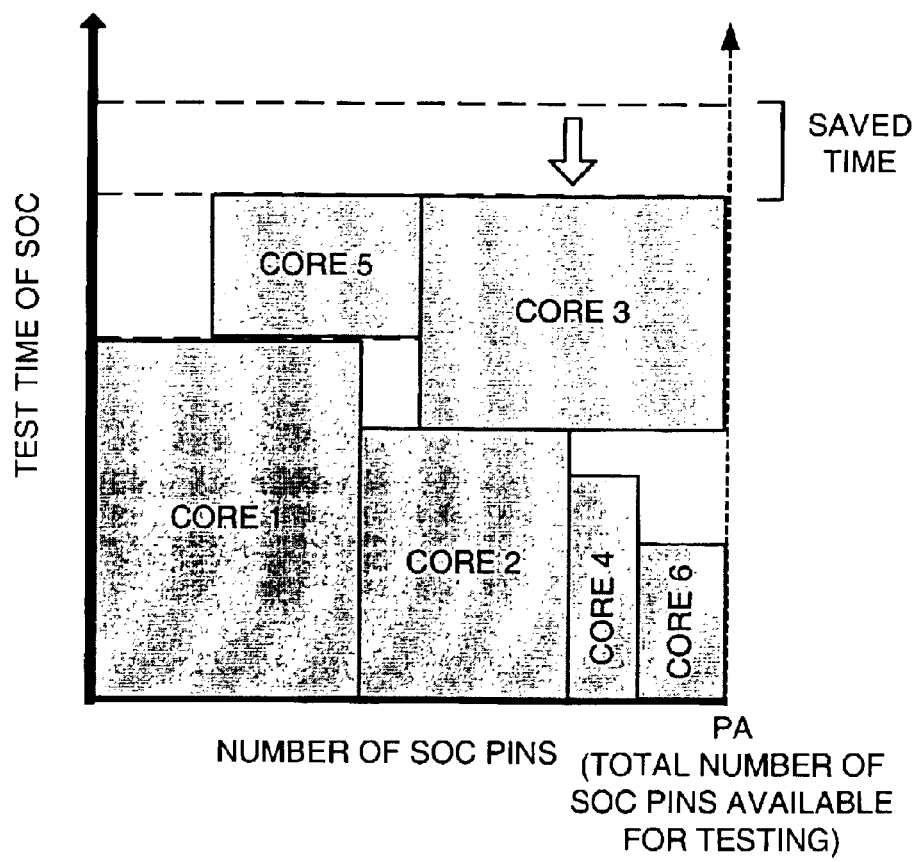
FIG. 21 is a second illustration of the test schedule optimization procedure used in the first representative embodiment.

FIGS. 20 and 21 illustrate the test schedule optimization procedure using the exemplary rectangles discussed with respect to FIGS. 12, 14–18. FIG. 20 illustrates process block 170 of FIG. 19. In the embodiment shown, the order of the rectangles is flipped on every other level beginning with the second level. Because there are only two levels, only the second level is reversed. FIG. 21 illustrates process block 172 of FIG. 19, where it is determined whether any of the rectangles of the flipped level can utilize unused space of the previous level. Here, the core 3 rectangle can be fit into unused space of the first bin level. Thus, according to process blocks 174 and 176 of FIG. 19, the rectangle is placed into the unused space so long as the peak power constraint is satisfied, resulting in the saving of time in the overall testing of the SOC ("saved time" in FIG. 21).

After optimization of the test schedule, an actual test schedule may be developed according to the manner and order in which the rectangles are fit into the bin.

Second Representative Embodiment

Figure 22:
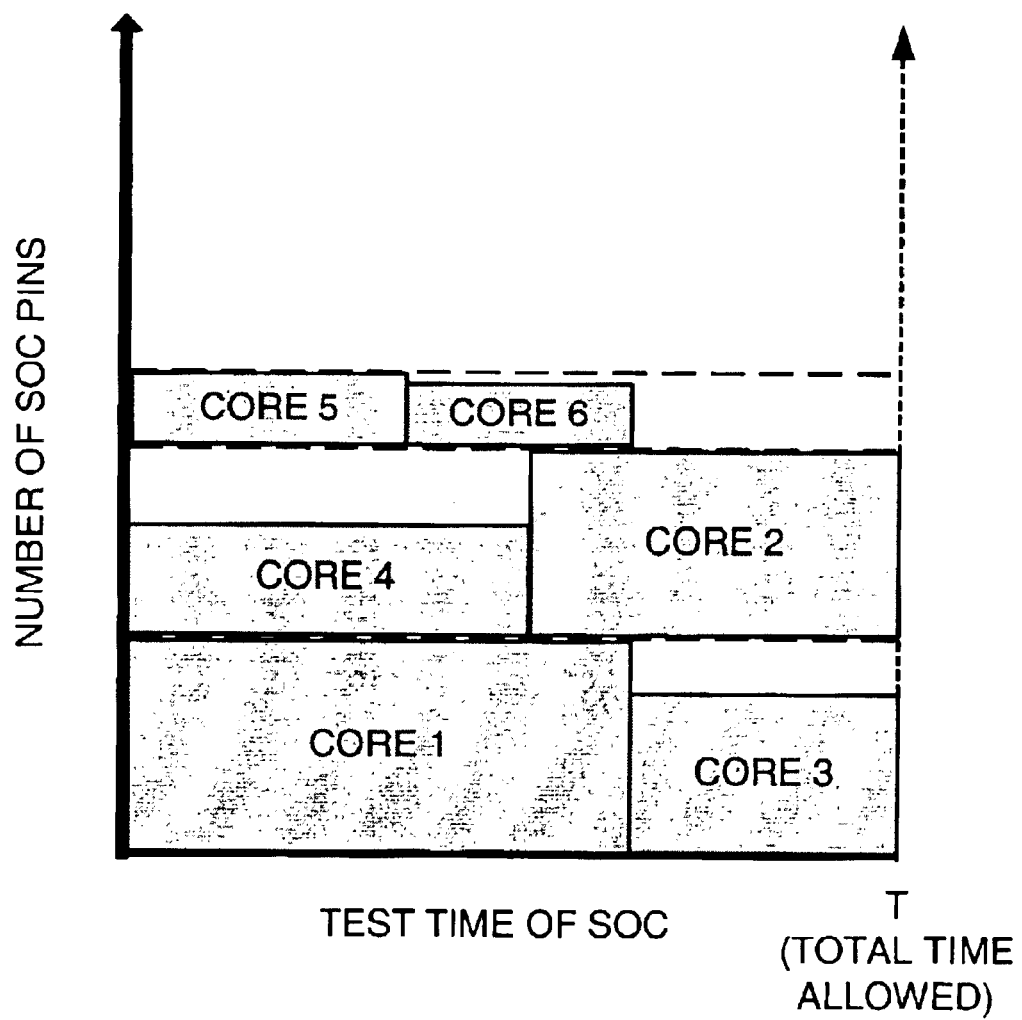
FIG. 22 is an illustration of a second representative embodiment.

A second representative embodiment is similar to the first, except that instead of the total number of SOC pins available for testing (PA) being known and used as the relevant constraint, a maximum test time of the SOC is known and used as the constraint. Thus, the dimensions of (1) SOC pins used to test the core, and (2) core test time, are swapped for the core representations; and the dimensions of (1) number of SOC pins, and (2) test time of SOC, are swapped for the bin representation. In this embodiment, the multiple bin levels correspond to integrated circuit pin groups used to test the cores within a fixed test time. After swapping these dimensions, one skilled in the art can utilize the principles and methods discussed with regard to the first embodiment to optimize the test schedule of the SOC using a maximum test time of the SOC as the relevant constraint. FIG. 22 illustrates a possible bin fit according to this embodiment.

Third Representative Embodiment

A third representative embodiment of the subject method formulates the task of scheduling the concurrent testing of cores as a three-dimensional bin-packing problem.

FIG. 10 again shows the overall methodology employed. First, in process block 110, the testing of each core is converted into multi-dimensional core test representations and the SOC test schedule is converted into a multi-dimensional bin configured to hold and be packed by the core test representations. Second, in process block 112, a test schedule is created by fitting the multiple core test representations into the bin. Third, in process block 114, the test schedule is optimized by searching for unused space in the bin and fitting any remaining test representations into the unused space.

In this embodiment, the testing of each core is converted into cubic representations and the SOC test schedule is converted into a three-dimensional bin. During scheduling, then, the cubic representations are fit into the three-dimensional bin. By extending the method into three-dimensions, however, a unique restriction on how the cubic representations can be fit into the bin is presented. Namely, cubes in a single level of the bin cannot overlap in the dimensions of peak power and number of SOC pins. This constraint results from the fact that the SOC pins and peak power that are already being used to test one core cannot be concurrently shared to test a different core.

Figure 23A:
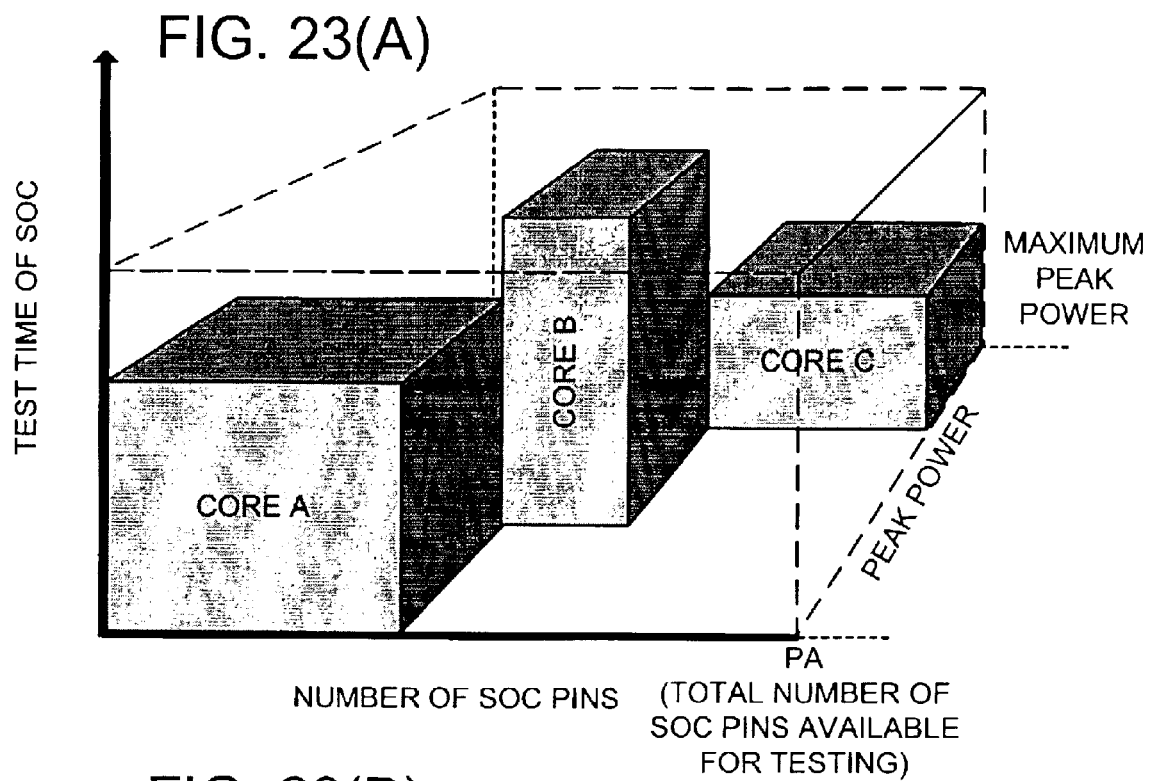
FIG. 23(a) is a perspective view of a three-dimensional bin containing three exemplary cubic representations of core tests.
Figure 23B:
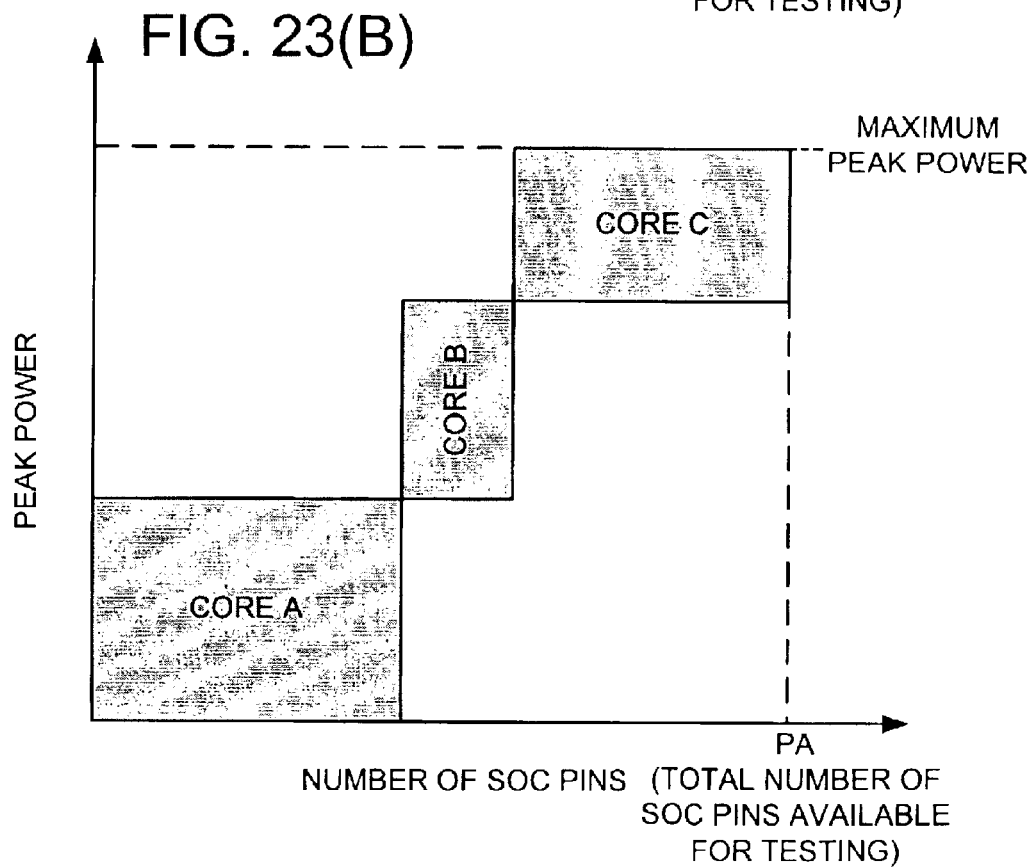
FIG. 23(b) is a plan view of the three-dimensional bin containing three exemplary cubic representations of core tests.

This constraint is illustrated in FIGS. 23(a) and 23(b). FIG. 23(a) is a perspective view of the three-dimensional bin containing three exemplary cubic representations of core tests (cores A, B, and C). Because the cubes cannot overlap in dimensions of peak power and SOC pins, they are placed along a diagonal line within the bin. This placement is best shown by FIG. 23(b), which shows a plan view of the bin in FIG. 23(a).

Figure 24:
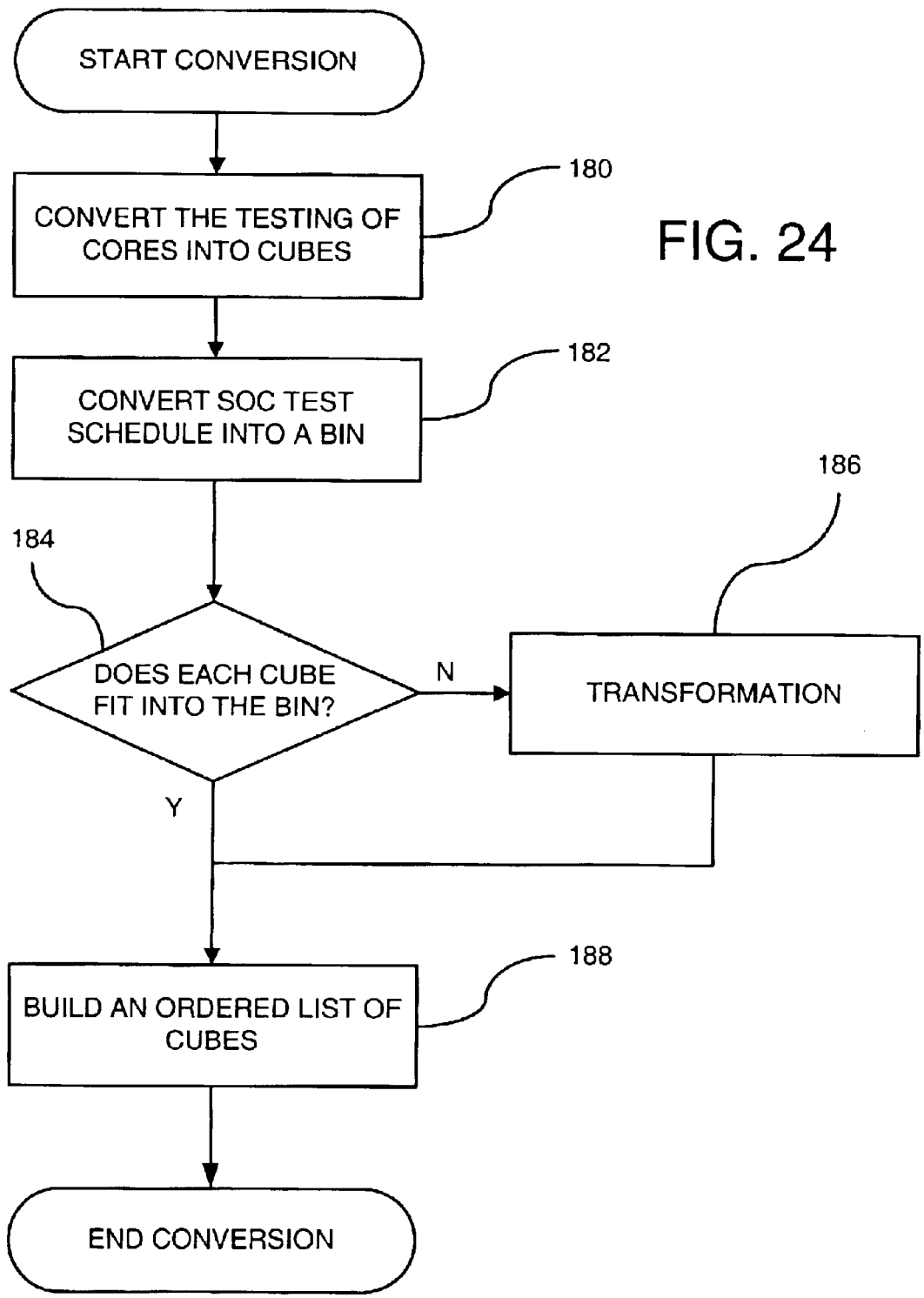
FIG. 24 is a flowchart of the core conversion and ordering procedure used in a third representative embodiment.

The conversion process for the third embodiment (process block 110 of FIG. 10) is similar to the conversion process utilized in the first representative embodiment. The flowchart of FIG. 24 outlines the conversion process for this embodiment. First, in process block 180, the testing of the cores are converted into cubic representations. This initial conversion is typically performed assuming that any internal scan chains of the core are concatenated to form a single scan chain such that the core can be tested using a minimum of core pins. However, the conversion may be done assuming other circuit configurations. In process block 182, the test schedule of the SOC is converted into a three-dimensional bin. Then, in process blocks 184 and 186, a transformation is performed on any of the representations that do not initially fit into the bin so that they do fit into the bin. Finally, in process block 188, the representations are placed in an ordered cube list. In one particular implementation of this embodiment, the representations are placed in descending order of their area ($A_i$), which is defined as the product of the cube's width ($W_i$) and height ($H_i$) (i.e., the number of SOC pins used to test the core×the core test time).

Figure 25:
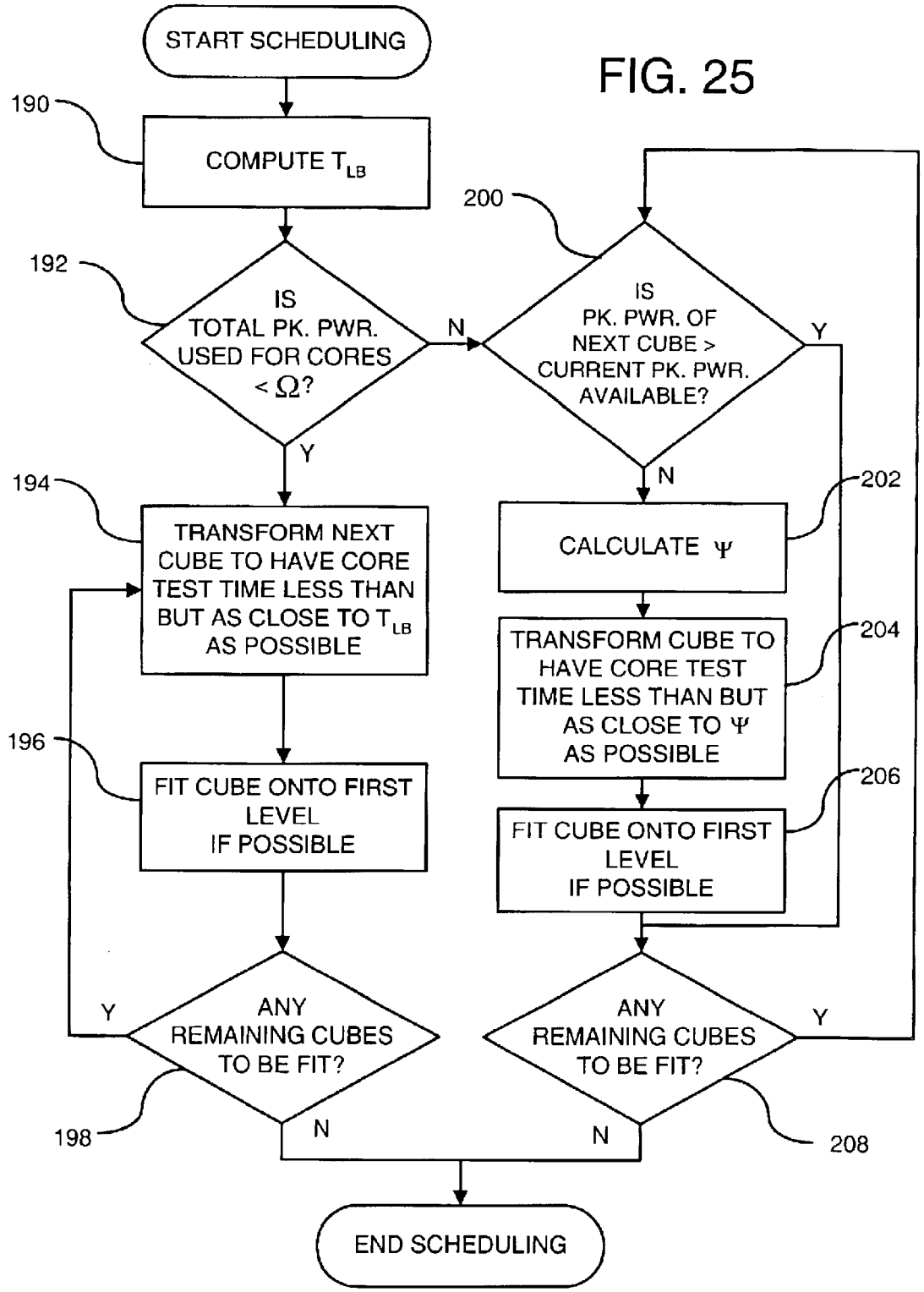
FIG. 25 is a flowchart of the scheduling procedure used in the third representative embodiment.

FIG. 25 is a flowchart showing the process of scheduling (process block 112 of FIG. 10) as performed in the third representative embodiment. First, in process block 190, a test time $T_{LB}$ is calculated according to the following relationship:

$$T_{LB} = \sum_{i=1}^{k} \frac{A_i}{N}$$

where $A_i$ is the area of cube i, N is the total number of SOC pins available for testing, and k is the number of cores to be scheduled. As discussed below, $T_{LB}$ is used to calculate an optimal test time ($\Psi_i$) for each core. In process block 192, a determination is made as to whether the total peak power used to test all the cores is less than the maximum peak power of the SOC ($\Omega$)

$$\left(\text{i.e., whether} \sum_{i=1}^{k} P_i \leq \Omega\right).$$

If it is determined that the total peak power used to test all the cores is less than or equal to the maximum peak power of the SOC ($\Omega$), then the optimal test time ($\Psi_i$) for each core is considered to be $T_{LB}$. In process block 194, a transformation is performed for the next cube on the ordered list such that the core test time is less than but as close to $T_{LB}$ as possible and such that the number of SOC pins used to test the core at this time is minimized. As discussed above, a transformation can be performed by serially accessing the memory elements of a wrapper scan chain or by concatenating the internal scan chains of the core. In process block 196, the transformed cube is fit onto the first level of the bin so long as there are sufficient unallocated SOC pins that can be used to test the core. Otherwise, the cube is returned to the list. In process block 198, a determination is made as to whether there are any remaining cubes in the list that have not been fit. The scheduling procedure (process block 112 in FIG. 10) ends once each cube has been fit or been considered for fitting.

If it is determined that the total peak power used to test all the cores is more than the maximum peak power of the SOC ($\Omega$), then a determination is made at process block 200 as to whether the next cube on the list can be tested on the first bin level without exceeding the current peak power available on the level. The current peak power available on the level is equal to the maximum peak power of the SOC ($\Omega$) reduced by the amount of peak power used by the cubes already placed on the level. If the peak power required to test the cube exceeds the current peak power available on the level, then the cube is returned to the list and, in process block 208, a determination is made as to whether there are any remaining cubes in the list that have not been fit. If the peak power required does not exceed the current peak power available, then, in process block 202, the optimal test time ($\Psi_i$) is calculated based on the maximum peak power of the SOC ($\Omega$). The optimal test time ($\Psi_i$) is calculated using the following relationship:

$$\Psi_i = T_{LB}\left(1 - \frac{P_i}{\Omega}\right)$$

where $P_i$ is the peak power required to test core i, and $\Omega$ is the maximum peak power of the SOC. In process block 204, a transformation is performed for the cube such that the core test time is less than but as close to $\Psi_i$ as possible. This transformation typically decreases the time required to test the core by increasing the parallel access to the core. Then, in process block 206, the cube is fit onto the first level of the bin if there are sufficient SOC pins to fit the cube. Otherwise, the cube is returned to list. In process block 208, a determination is made as to whether there are any remaining cubes in the list that have not been fit. Process block 112 in FIG. 10 ends once each cube has been fit or been considered for fitting.

In either of the above cases, if there are still unallocated SOC pins in the bin after all the cubes have been considered for scheduling, then the last core fit into the bin is transformed so that it utilizes all of the unused SOC pins or so that the test time of the cube is minimized. This transformation may further reduce the cube's height by increasing the number of SOC pins used to test the core.

The two different calculations used to determine $\Psi_i$ result from the competing interests involved. If peak power is not a concern, it is desirable to test the cores as concurrently as possible without exceeding $T_{LB}$. Thus, the number of SOC pins used to test each core is minimized. On the other hand, if peak power is a concern, it is desirable to minimize the time used to test the cores having the greatest peak power. Thus, a transformation is performed to reduce the test time of the cores by an amount proportional to the maximum peak power of the SOC, thereby increasing parallel access to the cores and decreasing the overall test time of the SOC.

Figure 26:
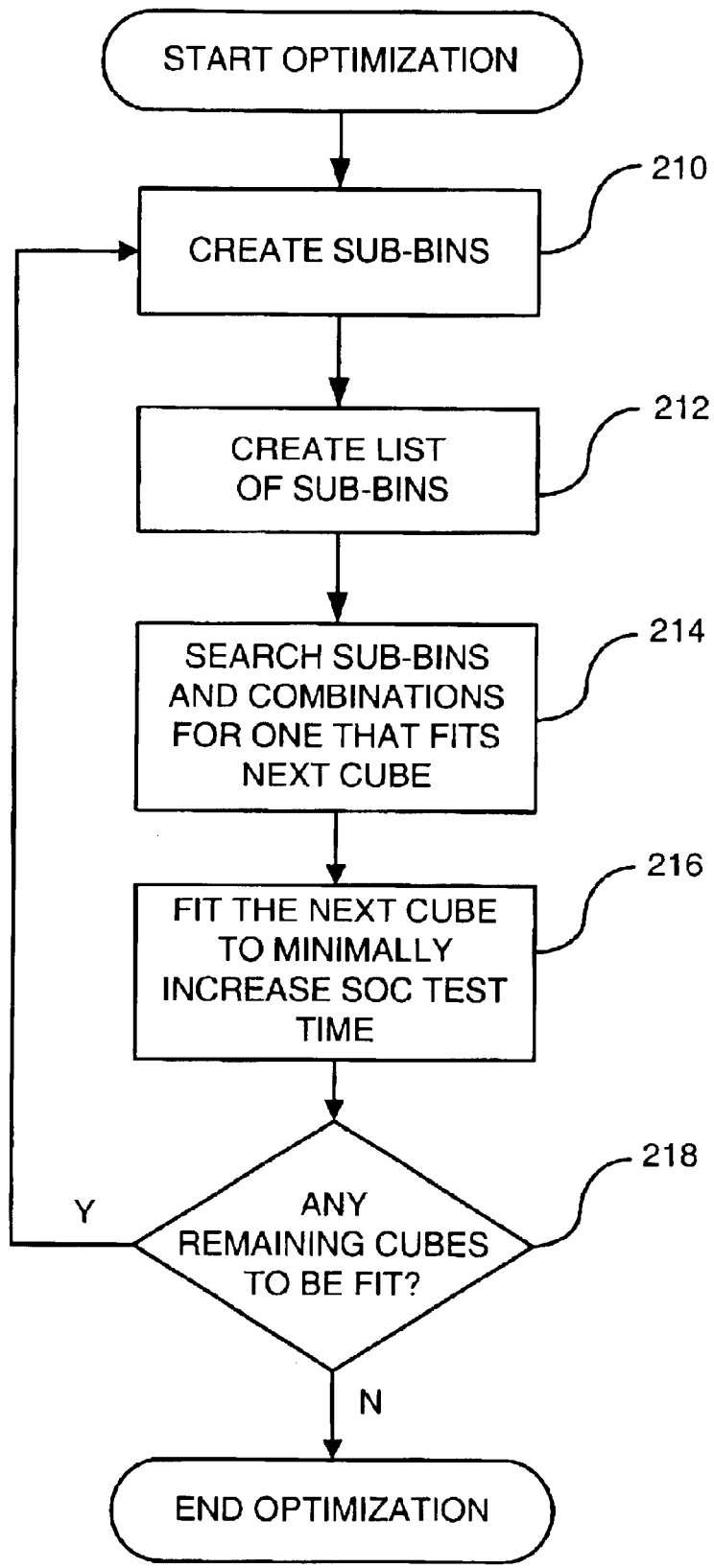
FIG. 26 is a flowchart of the test schedule optimization procedure used in the third representative embodiment.

FIG. 26 is a flowchart showing the process of test schedule optimization (process block 114 in FIG. 10) as performed in the third representative embodiment. In process block 210, the bin is divided into sub-bins based on the cores already fit into the bin. A sub-bin comprises an unfilled space in the bin into which a core can be scheduled to be tested. Typically, a sub-bin has a width corresponding to the width of a previously scheduled core and a height corresponding to the available time for which a new core can be scheduled. The length of a sub-bin, which represents the available peak power of the sub-bin, is determined by the cores that are scheduled to be tested during the same time period. Specifically, the length of the sub-bin is found by reducing the maximum peak power of the SOC ($\Omega$) by the sum of the peak powers used by the cores scheduled for testing during the same time period. In process block 212, each sub-bin is assigned a number based on its height (i.e., based on the time it is scheduled to be tested in the SOC). In one alternative embodiment, the lowest sub-bin is assigned the number 0, the next highest sub-bin the number 1, and so on until the last sub-bin is assigned a number.

In process block 214, the sub-bins are searched to find the first sub-bin or combination of sub-bins that fit the next cube on the ordered list. During this process, the sub-bins are searched for the sub-bin or combination of sub-bins that fit the core while minimally increasing the total test time after the core is fit. In one alternative embodiment, the search begins with sub-bin 0 and proceeds in the following order: {sub-bin 1}, {sub-bin 1+sub-bin 0}, {sub-bin 2}, {sub-bin 2+sub-bin 1}, {sub-bin 2+sub-bin 1+sub-bin 0}, etc. When a combination of sub-bins is considered, the height and length of the sub-bin having the highest number in the combination determines the height and length for the whole combination. Further, because the pins used to test the cubes need not be adjacent to one another, it is not necessary to combine only those sub-bins that are adjacent to one another in the bin. Thus, a cube can be divided into "sub-cubes" and scheduled into non-adjacent sub-bins of the bin. For each sub-bin or combination considered, the cube is transformed, if possible, such that all of the available pins in the sub-bin or combination of sub-bins are utilized or until the core reaches a maximum permissible width, at which point the core's test time cannot be decreased by using more SOC pins. For each transformation, a core test time and a total SOC test time with the core scheduled in the selected sub-bin are computed. The searching procedure continues until all of the sub-bins and combinations of sub-bins have been searched or until the maximum permissible width of the cube is reached.

In process block 216, the cube is placed into the sub-bin or combination of sub-bins that minimally increases the total test time. In process block 218, a determination is made as to whether there exist any remaining cubes in the list that need to be fit. If so, bin-optimization is repeated for the next core on the list until the list is empty. Otherwise, the test schedule optimization procedure ends.

Figure 27:
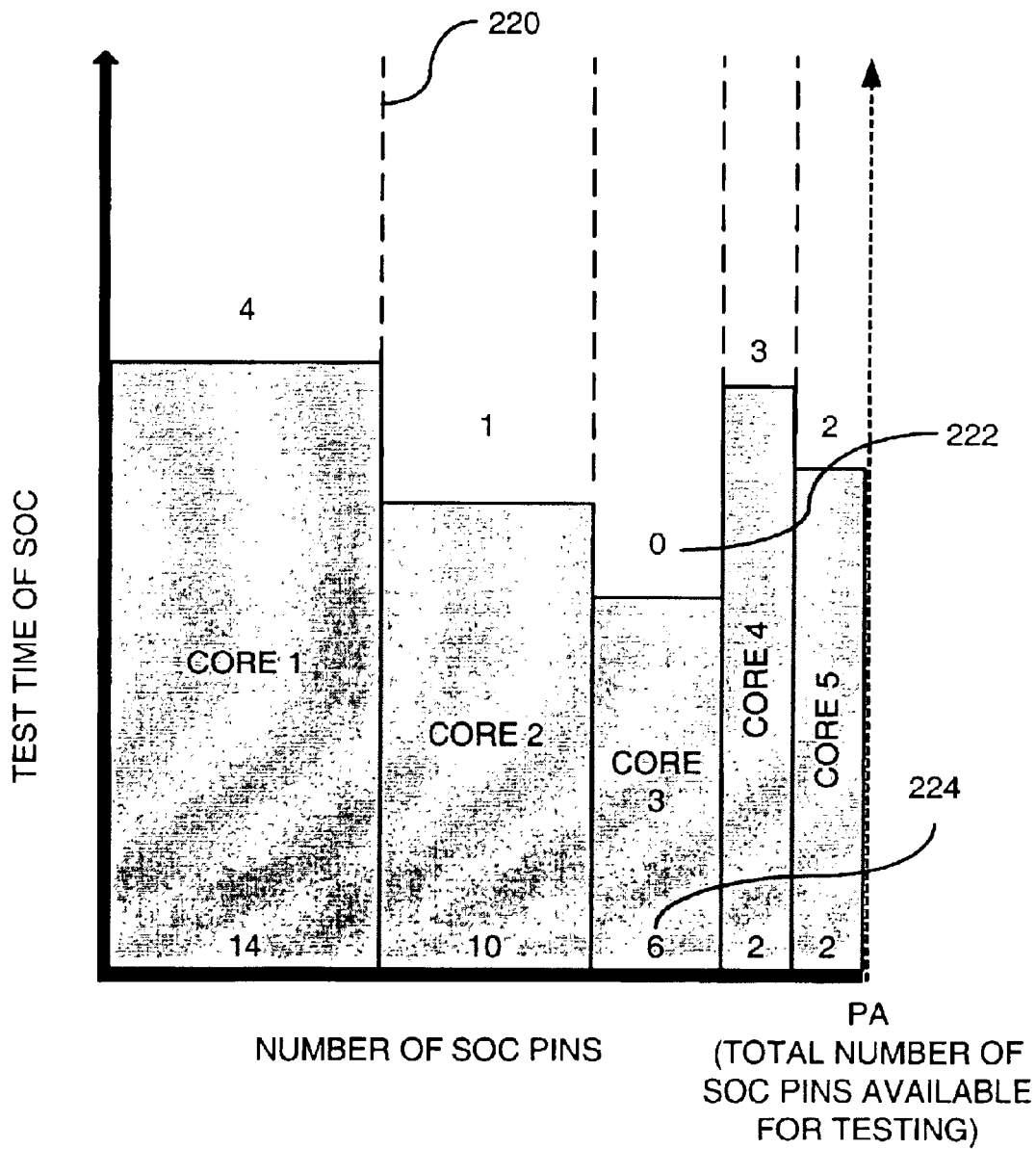
FIG. 27 is a first illustration of the test schedule optimization procedure used in the third representative embodiment.
Figure 28:
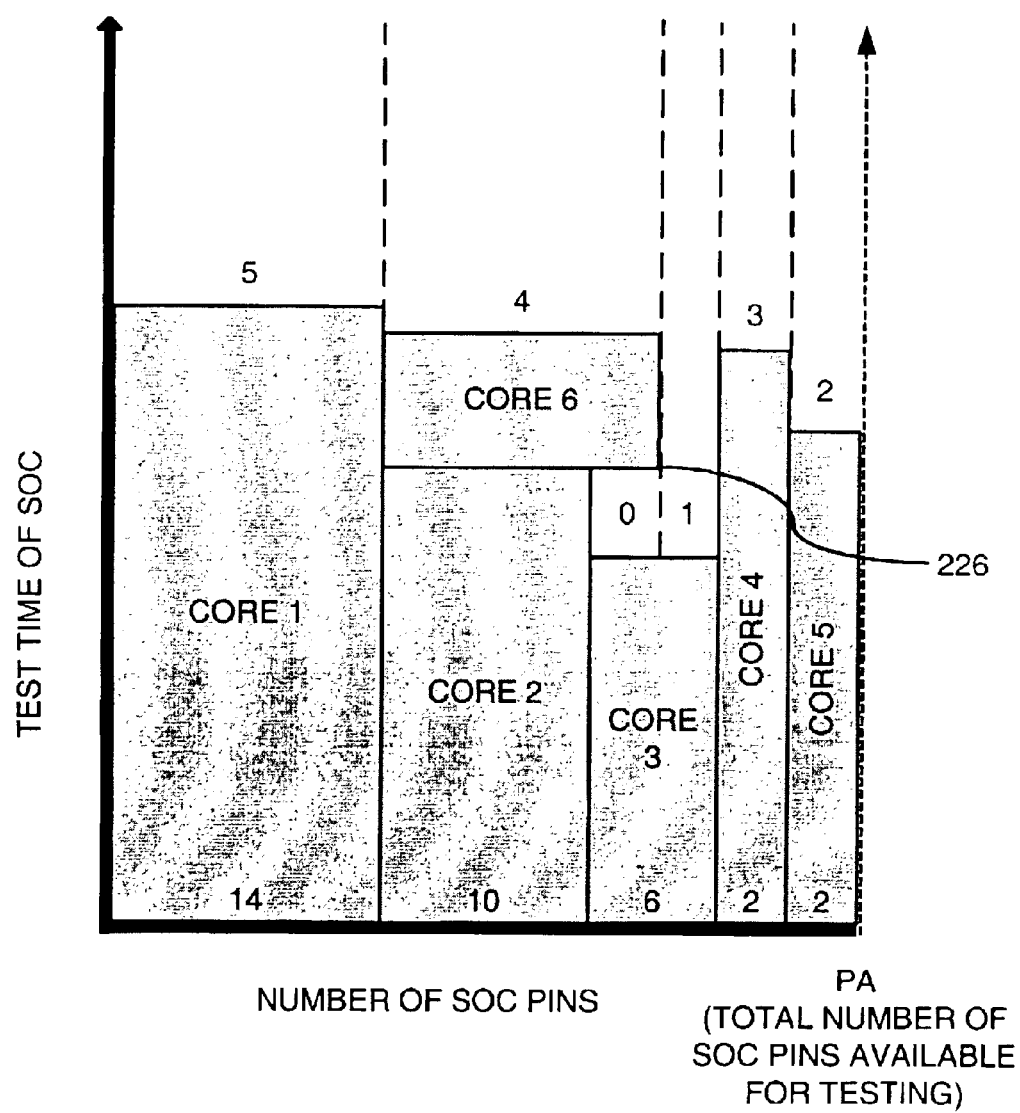
FIG. 28 is a second illustration of the test schedule optimization procedure used in the third representative embodiment.
Figure 29:
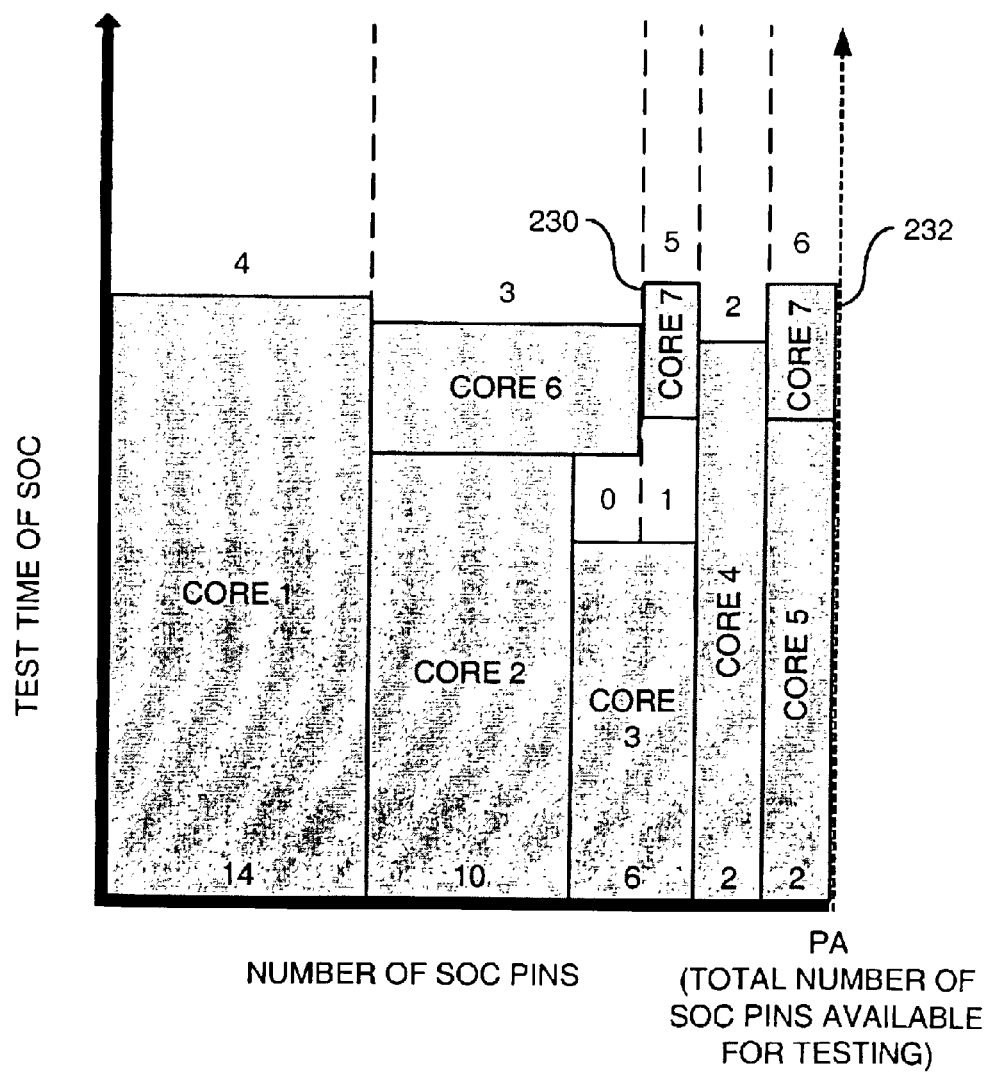
FIG. 29 is a third illustration of the test schedule optimization procedure used in the third representative embodiment.

FIGS. 27–29 illustrate the test schedule optimization procedure using seven exemplary cubes. Although the figures show only two dimensions, it is understood that the bins have a third-dimension (peak power) extending into the page. FIG. 27 shows the first five cubes placed into the first bin level after scheduling. Dashed lines 220 demarcate the sub-bins that are created according to process block 212 of FIG. 26. Each sub-bin is then assigned a number 222 based on the ascending order of the heights of the sub-bin (i.e., the relative SOC test time) beginning with the number 0. Further, each sub-bin has a width 224 corresponding to the number of SOC pins used to test each cube.

FIG. 28 illustrates the placement of cube 6 into the bin. According to process block 214 of FIG. 26, a search of the sub-bins from FIG. 27 is first conducted to determine the sub-bin or combination of sub-bins into which the core can be placed while minimally increasing the total test time of the SOC. First, sub-bin 0 is considered. The cube representing core 6 is transformed such that it fits into sub-bin 0 and a total SOC test time is calculated. Next, sub-bin 1 is considered using the same process. Next, the combination of sub-bin 1 and sub-bin 0 is considered. Note that for each sub-bin or combination of sub-bins, the peak power constraint must also be satisfied. In other words, the length of the cube must be less than the length of the sub-bin or combination of sub-bins for which the cube is being considered.

For purposes of this example, assume that the maximum width for cube 6 is 12 SOC pins, at which point an increase in the number of SOC pins does not further reduce the core test time. Thus, for the combination of sub-bin 1 and sub-bin 0, cube 6 is transformed to only use 12 SOC pins and the total test time of the SOC is computed. Next, the configuration that results in the minimum increase in overall SOC test time is selected. In this example, assume that the optimal configuration is the combination of sub-bin 1 and sub-bin 0 where cube 6 is transformed to be tested using 12 SOC pins. Thus, according to process block 216 of FIG. 26, cube 6 is placed in the selected sub-bin combination and the process of test schedule optimization is repeated for the next core.

FIG. 28 further illustrates the creation and ordering of sub-bins after cube 6 has been fit. Note that sub-bin 0 now has a "roof" 226 of a limited height, creating a time limit in which a core may be tested in sub-bin 0. Thus, when sub-bin 0 is being considered during the search for sub-bins or sub-bin combinations, no cube can be placed in sub-bin 0 that cannot be tested within the time constraint imposed by the roof.

FIG. 29 illustrates the placement of the next cube on the list, cube 7, into the bin. Like the placement of cube 6, a search of the sub-bins or combinations of sub-bins from FIG. 28 is conducted to determine the optimal scheduling for cube 6. In this example, fitting cube 7 into the combination of sub-bin 2 and sub-bin 1 from FIG. 28 results in the minimum increase in overall test time. Accordingly, cube 7 is divided into sub-cubes 230 and 232 and scheduled into both sub-bins, despite the sub-bins not being adjacent to one another. FIG. 29 also illustrates the creation and ordering of sub-bins after cube 7 has been fit.

Test schedule optimization proceeds in this manner until all of the cubes in the list have been fit. After test schedule optimization, an actual test schedule may be developed according to the manner and order in which the cubes are fit into the bin.

Fourth Representative Embodiment

A fourth representative embodiment is similar to the third, except that instead of the total number of SOC pins available for testing (PA) being known and used as the relevant constraint, a maximum test time of the SOC is known and used as the constraint. Thus, the dimensions of (1) SOC pins used to test the core, and (2) core test time, are swapped for the core representations; and the dimensions of (1) number of SOC pins, and (2) test time of SOC, are swapped for the bin representation. After swapping these dimensions, one skilled in the art can utilize the principles and methods discussed with regard to the third embodiment to optimize the test schedule of the SOC using a maximum test time of the SOC as the relevant constraint.

Having illustrated and described the principles of the above embodiments, it will be apparent to those skilled in the art that the embodiments can be modified in arrangement and detail without departing from such principles.

For example, a weighted cost function may be used to determine the respective importance of both the overall test time of the SOC and the number of SOC pins used to test the cores. The test scheduling may then be performed according to this function, thus allowing both the time and pin constraints to be considered simultaneously.

Additionally, the core test representations and the test schedule of the SOC may be expanded beyond the two or three dimensions discussed above to include any number of dimensions (i.e., n dimensions). The additional dimensions may be used to optimize the test schedule with respect to other possible constraints (e.g., the frequency of operation in the cores).

Moreover, the method may be used to schedule cores using internally generated test patterns (e.g., cores using Built-In-Self-Test (BIST) technology). In this case, because the test patterns are generated internally within the core, the number of SOC pins used to test the core will usually be small.

Fifth Representative Embodiment

Figure 30:
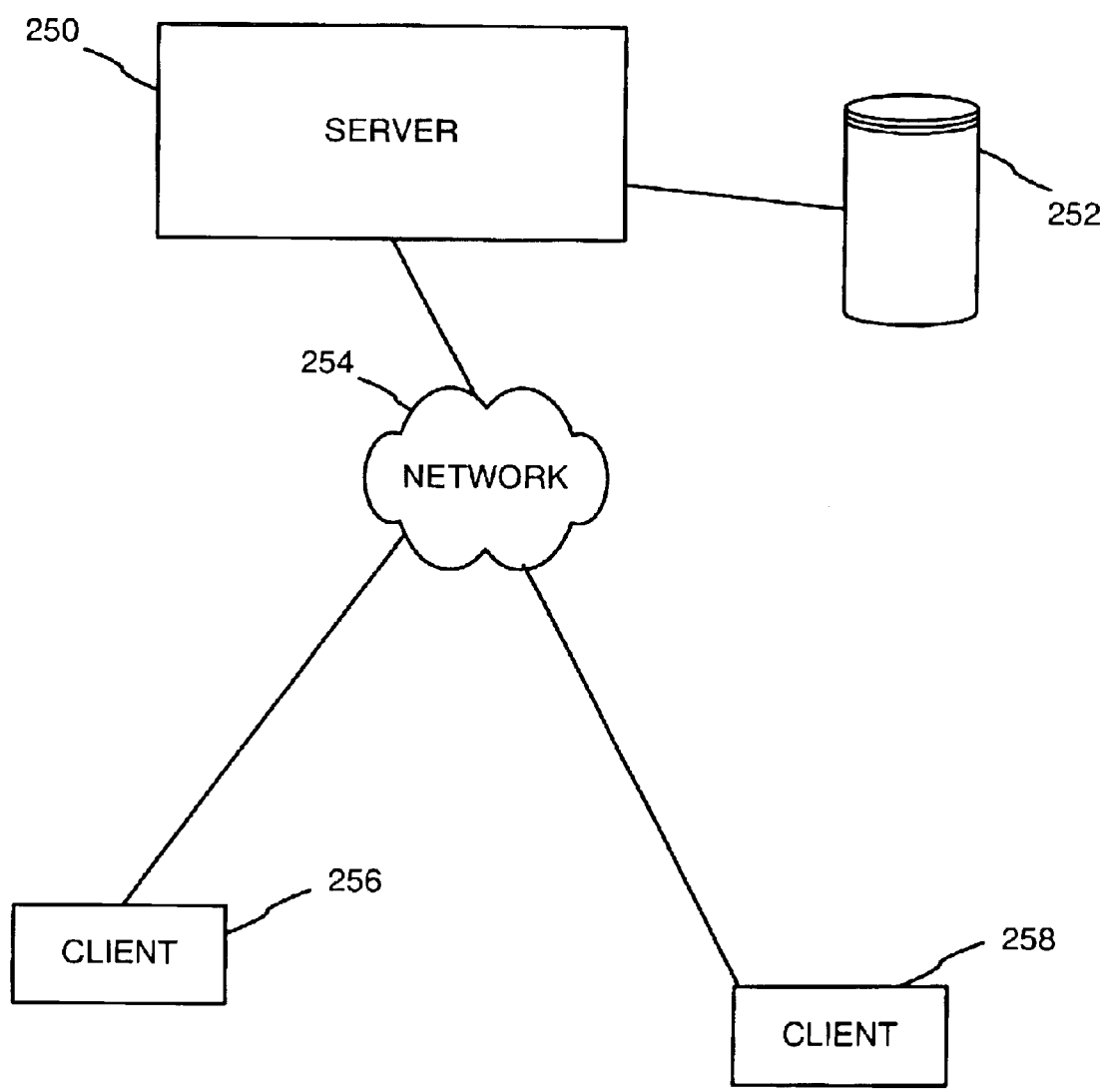
FIG. 30 is a system diagram of a client/server network for implementing the disclosed test schedule optimization procedures.

A fifth embodiment comprises any of the methods described in the above embodiments applied in a distributed computer network. FIG. 30 shows an exemplary network. A server computer 250 may have an associated database 252 (internal or external to the server computer). The server computer 250 may be configured to perform any of the methods associated with the above embodiments. The server computer 250 may be coupled to a network, shown generally at 254. One or more client computers, such as those shown at 256 and 258, may be coupled to the network 254 and interface with the server computer 250 using a network protocol.

Figure 31:
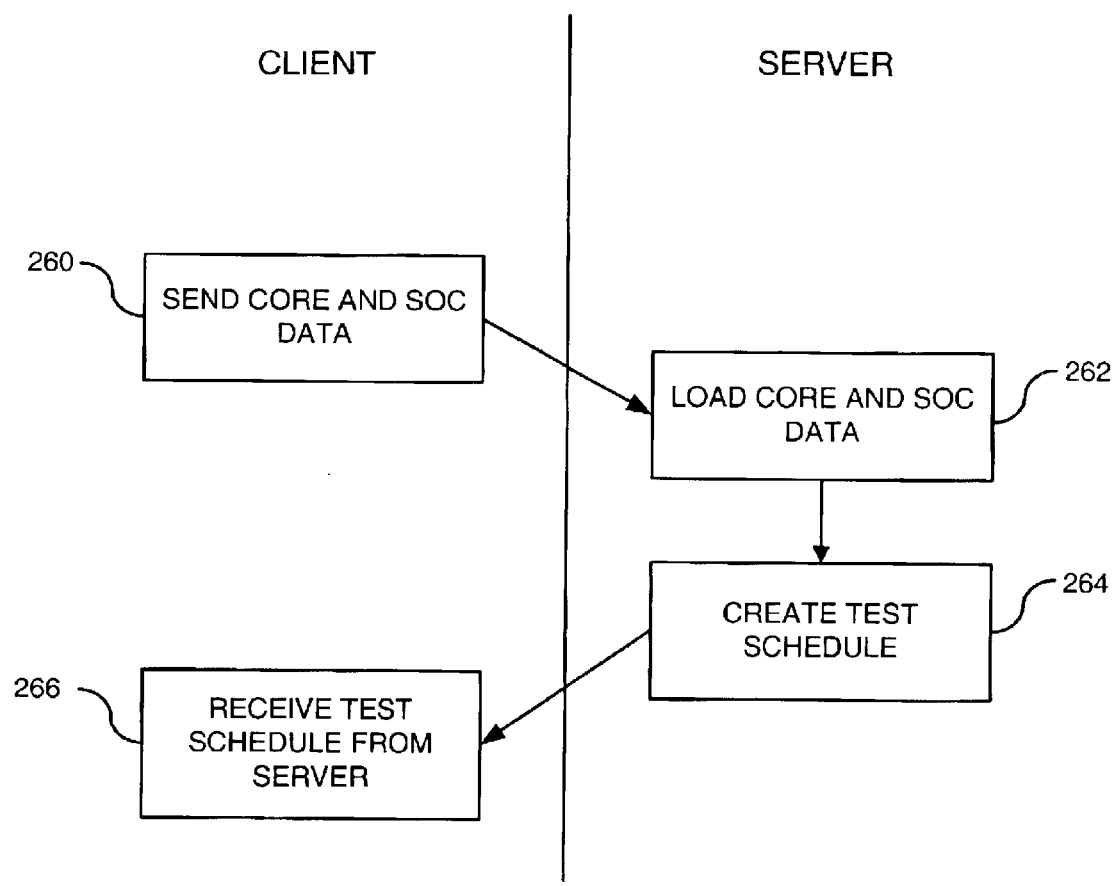
FIG. 31 is a flowchart showing the creation of a test schedule using the network of FIG. 30.

FIG. 31 shows that the test scheduling may be accomplished in part by a remote server computer, such as a server computer 250 in FIG. 30. In process block 260, the client computer sends data relating to the cores to be tested and to the SOC in which the cores are embedded. In process block 262, the core and SOC data is received and loaded by the server computer. In process block 264, a test schedule is created according to any of the embodiments described above. In process block 266, the client computer receives the schedule sent by the server computer.

In view of the many possible embodiments to which the principles of the invention may be applied, it should be recognized that the illustrated embodiments are only representative examples of the invention and should not be taken as a limitation on the scope of the invention. Rather, the scope of the invention is defined by the following claims. We therefore claim as our invention all that comes within the scope of the claims.

What is claimed is:

1. A method for optimizing concurrent testing of cores within an integrated circuit comprising:

representing testing of multiple cores, wherein a test of an individual core is represented as a function of at least integrated circuit pins used to test the core and core test time;

representing a test schedule of the integrated circuit as a bin having dimensions of at least integrated circuit pins and integrated circuit test time; and scheduling the testing of the cores within the integrated circuit by fitting the multiple core test representations into the bin.

2. The method of claim 1, wherein each core test representation comprises a database entry having two parameters including integrated circuit pins used to test the core and core test time.

3. The method of claim 1, wherein the integrated circuit is a system-on-chip.

4. The method of claim 1, wherein the bin dimension of the integrated circuit pins is fixed and scheduling is performed to minimize the bin dimension of the integrated circuit test time.

5. The method of claim 1, wherein the bin dimension of the integrated circuit test time is fixed and scheduling is performed to minimize the bin dimension of the integrated circuit pins.

6. The method of claim 1, wherein the scheduling comprises ensuring that at least one core test representation fits into the bin by performing a transformation that alters the dimensions of the core test representation.

7. The method of claim 6, wherein the transformation corresponds to accessing memory elements of a scan chain configured to access respective core pins or to concatenating multiple internal scan chains of the core.

8. The method of claim 1, wherein the representing a test of a core is performed for each core and scheduling comprises arranging the core test representations into a list according to core test time.

9. The method of claim 1, wherein the bin comprises multiple bin levels and the representations are fit onto the bin levels.

10. The method of claim 9, wherein the bin levels comprise multiple test sessions.

11. The method of claim 9, wherein each of the bin levels has a height corresponding to the core test time of the first core test representation fit on the level.

12. The method of claim 9, wherein the scheduling comprises fitting a core test representation onto an unfilled bin level having the fewest integrated circuit pins available for testing.

13. The method of claim 9, wherein the scheduling comprises fitting a core test representation onto an unfilled bin level by performing a transformation that alters the dimensions of the representation.

14. The method of claim 1, further comprising
determining whether a core can be fit without exceeding a peak power constraint; and
if the peak power constraint is exceeded, scheduling the representation to a time when the peak power constraint is satisfied.

15. The method of claim 1, wherein the scheduling comprises:
determining whether a representation from a first bin level can be partially fit into a second bin level; and
partially fitting the representation from the first bin level into the second bin level.

16. The method of claim 1, wherein a weighted cost function is used to determine the relative importance of integrated circuit test time and integrated circuit pins, and wherein the concurrent testing of the cores is optimized according to the function.

17. The method of claim 1, wherein the test of an individual core is further represented as a function of peak power used to test the core, and the test schedule of the integrated circuit is further represented as a function of peak power.

18. The method of claim 17, wherein each core test representation comprises a database entry having three parameters including integrated circuit pins used to test the core, core test time, and peak power used to test the core.

19. The method of claim 17, wherein the representing the testing of multiple cores is performed for each core and scheduling comprises arranging the core test representations into a list according to the product of the integrated circuit pins used to test the core and the core test time.

20. The method of claim 17, wherein the scheduling comprises performing a transformation on the core test representation to alter the core test time by an amount proportional to the peak power of the test schedule.

21. The method of claim 17, wherein the scheduling comprises fitting the core test representation onto a first level of the bin unless the first level is filled or the bin does not have sufficient integrated circuit pins or current peak power available to fit the core test representation.

22. The method of claim 17, wherein the scheduling comprises fitting the core test representation into a sub-bin or a combination of sub-bins that have a sufficient number of integrated circuit pins to fit the core test representation and that minimally increase the integrated circuit test time.

23. The method of claim 17, wherein the core test representation can be scheduled using non-adjacent sub-bins.

24. The method of claim 1, wherein the core test representation and the bin have more than three dimensions.

25. The method of claim 1, wherein at least one of the cores is tested using internally generated test patterns.

26. The method of claim 1 used to:
(a) test an integrated circuit;
(b) design test logic of an integrated circuit;
(c) determine the minimum test time of an integrated circuit; or
(d) determine the minimum number of test resources required to test an integrated circuit.

27. A computer program encoding the method of claim 1.

28. A computer programmed with the computer program of claim 27.

29. A client computer displaying or using a test schedule compiled by a server computer according to the method of claim 1, the client and server computers communicating via a network.

30. A method for testing multiple cores embedded in an integrated circuit comprising:
representing the testing of multiple cores, wherein each core is represented as at least a two-dimensional function and wherein the dimensions of each representation are uniform; and
using a bin-packing heuristic to optimize scheduling of the representations.

31. The method of claim 30, wherein each core is represented as a three-dimensional function.

32. The method of claim 30, wherein unscheduled integrated circuit pins can be assigned to test any unscheduled representation.

33. A method for testing multiple cores embedded in an integrated circuit comprising scheduling concurrent testing of multiple cores within the integrated circuit such that the testing occurs using a fixed number of integrated circuit pins, the scheduling comprising:
dividing the testing into multiple test sessions; and
assigning a testing of a core to a test session having fewer unassigned integrated circuit pins than other testing sessions.

34. The method of claim 33, wherein scheduling further comprises assigning the testing of a core to a test session such that a peak power constraint is not exceeded during the test session.

35. The method of claim 33, wherein scheduling further comprises assigning the testing of a core to multiple test sessions in order to reduce the overall test time of the cores.

36. A method for testing multiple cores embedded in an integrated circuit comprising scheduling concurrent testing of multiple cores within the integrated circuit such that the testing occurs within a fixed period of time and an overall number of integrated circuit pins used to test the cores is minimized, wherein the scheduling includes adjusting the number of integrated circuit pins used to test one or more cores so that the testing of the cores occurs within the fixed period of time.

37. The method of claim 36, wherein a test of an individual core is represented as a function of at least integrated circuit pins used to test the core and core test time, wherein a test schedule of the integrated circuit is represented as a bin having dimensions of at least integrated circuit pins and integrated circuit test time, and wherein the scheduling is performed by fitting the multiple core test representations into the bin.

* * * * *